US012562637B2

(12) United States Patent
    Azizi et al.

(10) Patent No.:    US 12,562,637 B2
(45) Date of Patent:        Feb. 24, 2026

---

(54) SYSTEM AND METHOD FOR DETERMINING ACTIVE AND REACTIVE CURRENTS DURING ASYMMETRICAL LOW-VOLTAGE RIDE THROUGH (LVRT) CONDITIONS

(71) Applicant: THE GOVERNING COUNCIL OF THE UNIVERSITY OF TORONTO, Toronto (CA)

(72) Inventors: Ali Azizi, Toronto (CA); Ali Hooshyar, Vaughan (CA); Amin Banaiemoqadamfariman, Toronto (CA); Mohammad Reza Iravani, Toronto (CA)

(73) Assignee: THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 176 days.

(21) Appl. No.: 18/689,518

(22) PCT Filed: Aug. 25, 2022

(86) PCT No.: PCT/CA2022/051288
     § 371 (c)(1),
     (2) Date: Mar. 6, 2024

(87) PCT Pub. No.: WO2023/035059
     PCT Pub. Date: Mar. 16, 2023

(65) Prior Publication Data
     US 2024/0388195 A1      Nov. 21, 2024

Related U.S. Application Data

(60) Provisional application No. 63/264,375, filed on Nov. 22, 2021, provisional application No. 63/241,793, filed on Sep. 8, 2021.

(51) Int. Cl.
     *H02M 1/32*        (2007.01)
     *H02M 1/00*        (2006.01)
     (Continued)

(52) U.S. Cl.
     CPC ......... *H02M 1/325* (2021.05); *H02M 1/0009* (2021.05); *H02M 7/5395* (2013.01); *G01R 19/06* (2013.01)

(58) Field of Classification Search
     CPC .... H02M 1/325; H02M 1/009; H02M 7/5395; G01R 19/06
     See application file for complete search history.

(56) References Cited

U.S. PATENT DOCUMENTS

| | | | |
|---|---|---|---|
| 8,379,416 B1 * | 2/2013 | Datta ................. | H02M 1/4216 |
| | | | 363/35 |
| 8,655,495 B2 | 2/2014 | Garcia | |

(Continued)

FOREIGN PATENT DOCUMENTS

| | | |
|---|---|---|
| CN | 107221960 B | 2/2020 |
| WO | 2020078517 A1 | 4/2020 |
| WO | 2020125882 A1 | 6/2020 |

OTHER PUBLICATIONS

International Search Report for PCT application No. PCT/CA2022/051288, CIPO, search completed: Sep. 26, 2022, mailed: Nov. 24, 2022.

(Continued)

*Primary Examiner* — Rafael O De Leon Domenech
(74) *Attorney, Agent, or Firm* — Bhole IP Law; Marc Lampert

(57)        ABSTRACT

There is provided a system and method for determining active and reactive currents during asymmetrical low-voltage ride through (LVRT) conditions at an inverter. The method including: receiving an indication of an LVRT (Continued)

condition; and where the largest phase current magnitude does not exceed a phase current limit, determining a maximum active current for associated positive-sequence and negative-sequence reactive currents by determining a largest active current magnitude and outputting the largest active current and associated positive-sequence and negative-sequence reactive currents to the inverter, otherwise: scaling down each of the positive-sequence and negative-sequence reactive currents, or superimposed positive-sequence and negative-sequence reactive currents, uniformly or non-uniformly to determine revised positive-sequence and negative-sequence reactive currents; where the magnitudes of all of the phase currents are below the phase current limit, determining a non-zero positive-sequence revised active current; and outputting the revised active current and the revised positive-sequence and negative-sequence reactive currents to the inverter.

20 Claims, 23 Drawing Sheets

(51) Int. Cl.
_H02M 7/5395_ (2006.01)
_G01R 19/06_ (2006.01)

(56) References Cited

U.S. PATENT DOCUMENTS

| | | | |
|---|---|---|---|
| 9,385,582 B2 | 7/2016 | Zheng et al. | |
| 9,631,608 B2 | 4/2017 | Garcia | |
| 10,320,196 B2 | 6/2019 | Gupta et al. | |
| 10,581,247 B1 | 3/2020 | Kolhatkar et al. | |
| 10,630,079 B2 | 4/2020 | Nelson et al. | |
| 10,704,534 B2 | 7/2020 | Biris et al. | |
| 11,400,817 B2 * | 8/2022 | Kunomura | B60L 15/007 |
| 2002/0008982 A1 * | 1/2002 | Jiang-Hafner | H02M 7/7575 |
| | | | 363/148 |
| 2007/0177314 A1 | 8/2007 | Weng et al. | |
| 2008/0252076 A1 * | 10/2008 | Fortmann | H02J 3/1885 |
| | | | 290/44 |
| 2009/0206606 A1 * | 8/2009 | Jorgensen | F03D 7/044 |
| | | | 290/44 |
| 2010/0052322 A1 | 3/2010 | Fortmann et al. | |
| 2010/0142237 A1 * | 6/2010 | Yuan | H02J 3/46 |
| | | | 290/44 |
| 2011/0317460 A1 * | 12/2011 | Garces | H02J 3/38 |
| | | | 333/175 |
| 2013/0313826 A1 * | 11/2013 | Gupta | H02M 1/32 |
| | | | 290/44 |
| 2014/0362617 A1 * | 12/2014 | Li | H02J 3/381 |
| | | | 363/79 |
| 2015/0137520 A1 * | 5/2015 | Garcia | H02J 3/50 |
| | | | 290/44 |

OTHER PUBLICATIONS

Written Opinion of the International Searching Authority for PCT application No. PCT/CA2022/051288, Cipo, opinion completed: Sep. 27, 2022, mailed: Nov. 24, 2022.
"Benchmark systems for network integration of renewable and distributed energy resources", CIGRE, Paris, France, Tech. Rep. C6.04.02, Apr. 2014.
"Grid Connection Regulations for High and Extra High Voltage", E.ON Netz GmbH, Bayreuth, Apr. 2006. [Online]. Available: https://bit.ly/36q8mJt.

"IEEE 39-bus system", Illinois Center for a Smarter Electric Grid (ICSEG), 2013, https://icseg.iti.illinois.edu/IEEE-39-bus-system/.
"IEEE Draft Standard for Interconnection and Interoperability of Inverter- Based Resources (IBR) Interconnecting with Associated Transmission Electric Power Systems", IEEE Standard 2800, Oct. 2021.
"Requirements for generating plants to be connected in parallel with distribution networks—Part 2: Connection to a MV distribution network—Generating plants up to and including Type B", CLC/TC 8X, Brussels, Jan. 2019. [Online]. Available: https://standards.iteh. ai/catalog/standards/clc/bd975a08-a7fc-47a1-9e46-b9c96cc2dafe/.
"Technical Requirements for the Connection and Operation of Customer Installations to the Extra High Voltage Network (TAR Extra High Voltage) VDE-AR-N 4130", Berlin, Nov. 2018. [Online]. Available: https://www.vde.com/en/fnn/topics/technical-connection-rules/tcr-extra-high-voltage.
"The Grid Code", National Grid Electricity System Operator Limited, Mar. 2017. [Online]. Available: https://bit.ly/35ktXE4.
Azizi, Ali , et al., "A Blind Spot in the LVRT Current Requirements of Modern Grid Codes for Inverter-Based Resources", IEEE Transactions on Power Delivery, vol. 38, No. 1, pp. 319-334, Feb. 2023, doi: 10.1109/TPWRD.2022.3187223.
Azzouz, M. A. , et al., "Resilience enhancement of microgrids with inverter-interfaced DGs by enabling faulty phase selection", IEEE Trans. Smart Grid, vol. 9, No. 6, pp. 6578-6589, Nov. 2018.
Bottrell, Nathaniel , et al., "Comparison of current-limiting strategies during fault ride-through of inverters to prevent latch-up and wind-up", IEEE Trans. Power Electron., vol. 29, No. 7, pp. 3786-3797, Jul. 2014.
Brandao, Danilo Iglesias , et al., "Active and reactive power injection strategies for three-phase four-wire inverters during symmetrical/asymmetrical voltage sags", IEEE Trans. Ind Appl., vol. 55, No. 3, pp. 2347-2355, May/Jun. 2019.
Camacho, Antonio , et al., "Active and reactive power strategies with peak current limitation for distributed generation inverters during unbalanced grid faults", IEEE Trans. Ind. Electron., vol. 62, No. 3, pp. 1515-1525, Mar. 2015.
Garnica López, Miguel Andres , et al., "Control strategy for grid-connected three-phase inverters during voltage sags to meet grid codes and to maximize power delivery capability", IEEE Trans. Power Electron., vol. 33, No. 11, pp. 9360-9374, Nov. 2018.
Hooshyar, Ali , et al., "Fault type classification in microgrids including photovoltaic DGs", IEEE Trans. Smart Grid, vol. 7, No. 5, pp. 2218-2229, Sep. 2016.
Islam, Monirul , et al., "A grid-support strategy with PV units to boost short-term voltage stability under asymmetrical faults", IEEE Trans. Power Syst., vol. 35, No. 2, pp. 1120-1131, Mar. 2020.
Lammert, Gustav , et al., "Control of photovoltaic systems for enhanced short-term voltage stability and recovery", IEEE Trans. Energy Convers., vol. 34, No. 1, pp. 243-254, Mar. 2019.
Liu, Xubin , et al., "Fault current hierarchical limitation strategy for fault ridethrough scheme of microgrid", IEEE Trans. Smart Grid, vol. 10, No. 6, pp. 6566-6579, Nov. 2019.
Shin, Dongsul , et al., "Implementation of fault ride-through techniques of grid-connected inverter for distributed energy resources with adaptive low-pass notch PLL", IEEE Trans. Power Electron., vol. 30, No. 5, pp. 2859-2871, May 2015.
Sochor, Paul , et al., "Low-voltage-ride-through control of a modular multilevel single-delta bridge-cell (SDBC) inverter for utility-scale photovoltaic systems", IEEE Trans. Ind Appl., vol. 54, No. 5, pp. 4739-4751, Sep./Oct. 2018.
Taul, Mads Graungaard , et al., "Current reference generation based on next-generation grid code requirements of grid-tied converters during asymmetrical faults", IEEE Trans. Emerg. Sel. Topics Power Electron., vol. 8, No. 4, pp. 3784-3797, Dec. 2020.
Weise, Bernd , "Impact of K-factor and active current reduction during faultride-through of generating units connected via voltage-sourced converters on power system stability", IET Renewable Power Gener., vol. 9, pp. 25-36, Jan. 2015.

* cited by examiner

2300

Receive pre-LVRT values
2302

Receive indication of low voltage
condition
2304

Capping the positive-sequence and
negative-sequence reactive currents
at prespecified limits
2306

Determine largest active current
magnitude
2308

Communicate revised reactive and
active currents
2310

SYSTEM AND METHOD FOR DETERMINING ACTIVE AND REACTIVE CURRENTS DURING ASYMMETRICAL LOW-VOLTAGE RIDE THROUGH (LVRT) CONDITIONS

TECHNICAL FIELD

The following relates, generally, to power inverters; and more particularly, to a system and method for determining active and reactive currents during asymmetrical low-voltage ride through (LVRT) conditions.

BACKGROUND

Modern grid codes (GCs) usually standardize the operation of inverter-based resources (IBRs) during low-voltage ride-through (LVRT) conditions. Conventionally, GCs require that the IBRs support the voltage during LVRT by injecting positive-sequence reactive current. More recently, however, some GCs mandate the generation of negative-sequence reactive current as well. As shown in the example of FIG. 1, which shows LVRT current requirement of certain GCs for IBRs (negative IQ is capacitive), some GCs require that an IBR's superimposed (or incremental quantities of) positive-sequence and negative-sequence reactive currents during LVRT be proportional to their respective voltages or voltage changes. In FIG. 1, Δ, Q, +, and − designate the superimposed, reactive, positive-sequence, and negative-sequence components, respectively. The curve's slope, K, is usually between 2 to 6. In this example curve, equal slopes have been considered for the positive and negative sequences. However, different slopes may also be considered for the curves of the positive and negative sequences; which would generally only affect the calculation of $\Delta I_Q^+$ and $\Delta I_Q^-$ from the curve of FIG. 1.

Regardless of the GC, an inverter's phase currents must be limited, necessitating a prioritization scheme for the different components of current. Some GCs give higher priority to the reactive component of an IBR's LVRT current over its active component. Once the reactive current requirement in FIG. 1 is satisfied, the inverter's remaining capacity must be used to maximize the positive-sequence active current, $I_p^+$. Meanwhile, depending on $\Delta V^\pm$, the $\Delta I_Q^\pm$ given by FIG. 1 may lead to phase currents beyond the inverter's limit. Under such conditions, $\Delta I_Q^+$ and $\Delta I_Q^-$ are reduced uniformly to limit the phase current. Thus, this LVRT requirement can be summarized as prioritization/maximization of $\Delta I_Q^\pm$ and maximization of $I_p^+$ while the phase current limit of an inverter is met.

SUMMARY

In an aspect, there is provided a method for determining active and reactive currents during asymmetrical low-voltage ride through (LVRT) conditions at an inverter, the method executable on a controller or executed as a model on a computer, the method comprising: receiving an indication of an LVRT condition; and where there is an active current such that the largest phase current magnitude does not exceed a phase current limit, determining a maximum active current for associated positive-sequence and negative-sequence reactive currents by determining a largest active current magnitude and outputting the largest active current and associated positive-sequence and negative-sequence reactive currents to the inverter, otherwise: scaling down each of the positive-sequence and negative-sequence reactive currents, or superimposed positive-sequence and negative-sequence reactive currents, to determine revised positive-sequence and negative-sequence reactive currents; where the magnitudes of all of the phase currents are below the phase current limit and a β condition for each phase after the scaling down is within a predetermined range, determining non-zero positive-sequence revised active current, the β condition based on a negative voltage angle ($\theta_{V^-}$) and a positive voltage angle ($\theta_{V^+}$); and outputting the revised active current and the revised positive-sequence and negative-sequence reactive currents to the inverter.

In a particular case of the method, determining whether there is an active current such that the largest phase current magnitude does not exceed a phase current limit comprises determining a maximum active current by determining ranges for the active current such that each phase current does not exceed the phase current limit and selecting the upper bound of the range.

In another case of the method, the β condition equals $\pi + \theta_{V^-} - \theta_{V^+}$, and wherein the predetermined range is 180o<β<360o if the phase current of an A-phase is equal to the phase current limit after the scaling down, the predetermined range is 180o<β−120o<360o if the phase current of a B-phase is equal to the phase current limit after the scaling down, or the predetermined range is 180o<β+120o<360o if the phase current of a C-phase is equal to the phase current limit after the scaling down.

In yet another case of the method, scaling down each of the positive-sequence and negative-sequence reactive currents comprises scaling uniformly based on a change in the positive-sequence and negative-sequence reactive currents.

In yet another case of the method, scaling down each of the positive-sequence and negative-sequence reactive currents comprises uniformly scaling by determining a scaling factor that causes at least one of the phase currents equal to the phase current limit.

In yet another case of the method, determining the scaling factor comprises: determining all of the possible solutions for the scaling factor using a quadratic relationship to the phase current limit; discarding any solutions to the scaling factor that are outside of the [0,1] range; and selecting a largest solution to the scaling factor that makes at least one of the phases equal to or below the phase current limit and the other phases below the phase current limit.

In yet another case of the method, the quadratic relationship comprises the scaling factor (ρ) related to the phase current limit ($I_{max}$) by $I_{max}^2 = \lambda_{2\varphi}\rho^2 + \lambda_{1\varphi}\rho + \lambda_{0\varphi}$, where coefficients $\lambda_{2\varphi}$, $\lambda_{1\varphi}$, and $\lambda_{0\varphi}$, are related to parameters of superimposed reactive currents, pre-fault positive-sequence reactive currents, and capacitor reactive currents.

In yet another case of the method, determining the non-zero positive-sequence revised active current comprises determining a magnitude of an active current that satisfies the relationship of $|I_\varphi| = I_{max} = \sqrt{|I_x|^2 + |I_y|^2}$, where $I_x$ comprises the positive-sequence reactive current ($I_Q^+$) and the angle between the positive-sequence reactive current and either the negative-sequence reactive current (β), the negative-sequence reactive current (β) minus 2π/3, or the negative-sequence reactive current (β) plus 2π/3, and $I_y$ comprises the negative-sequence reactive current ($I_Q^-$) and the angle between the positive-sequence reactive current and either the negative-sequence reactive current ($\beta$), the negative-sequence reactive current ($\beta$) minus $2\pi/3$, or the negative-sequence reactive current ($\beta$) plus a $2\pi/3$ In yet another case of the method, where the A-phase is the largest active phase current, the $I_x$ equal $$\left(|I_Q^+| + |I_Q^-|\cos\beta\right)\angle\left(\theta_{V^+} - \frac{\pi}{2}\right)$$

and the $I_y$ equals $(|I_Q^-|\sin\beta)\angle\theta_{V^+}$, where the B-phase is the largest active phase current, the $I_x$ equals $$\left(|I_Q^+| + |I_Q^-|\cos\left(\beta - \frac{2\pi}{3}\right)\right)\angle\left(\theta_{V^+} - \frac{\pi}{2}\right)$$

and the $I_y$ equals $$\left(|I_Q^-|\sin\left(\beta - \frac{2\pi}{3}\right)\right)\angle\theta_{V^+},$$

and where the C-phase is the largest active phase current, the $I_x$ equals $$\left(|I_Q^+| + |I_Q^-|\cos\left(\beta + \frac{2\pi}{3}\right)\right)\angle\left(\theta_{V^+} - \frac{\pi}{2}\right)$$

and the $I_y$ equals $$\left(|I_Q^-|\sin\left(\beta + \frac{2\pi}{3}\right)\right)\angle\theta_{V^+},$$

$\theta_{V^+}$ denoting a voltage angle.

In yet another case of the method, determining the non-zero positive-sequence revised active current such that the current of the A-phase is below the phase current limit comprises the magnitude of the active phase current limited to $-2|I_Q^-|\sin\beta$, such that the current of the B-phase is below the phase current limit comprises the magnitude of the active phase current limited to $$-2|I_Q^-|\sin\left(\beta - \frac{2\pi}{3}\right),$$

and such that the current of the C-phase is below the phase current limit comprises the magnitude of the active phase current limited to $$-2|I_Q^-|\sin\left(\beta + \frac{2\pi}{3}\right).$$

In yet another case of the method, scaling down each of the positive-sequence and negative-sequence reactive currents comprises non-uniform scaling where the negative-sequence reactive current is decreased at a higher rate than the positive-sequence reactive current.

In yet another case of the method, scaling down each of the positive-sequence and negative-sequence reactive currents comprises non-uniform scaling where the positive-sequence reactive current is decreased at a higher rate than the negative-sequence reactive current.

In yet another case of the method, scaling down each of the positive-sequence and negative-sequence reactive currents comprises non-uniform scaling where the positive-sequence reactive current is decreased at a higher rate than the negative-sequence reactive current and superimposed positive-sequence reactive currents are greater than superimposed negative-sequence reactive currents.

In yet another case of the method, scaling down each of the positive-sequence and negative-sequence reactive currents comprises non-uniform scaling using optimization, where the negative-sequence reactive current is decreased at a higher rate than the positive-sequence reactive current.

In yet another case of the method, scaling down each of the positive-sequence and negative-sequence reactive currents comprises non-uniform scaling using optimization, where the positive-sequence reactive current is decreased at a higher rate than the negative-sequence reactive current.

In yet another case of the method, scaling down each of the positive-sequence and negative-sequence reactive currents comprises non-uniform scaling using optimization, where the positive-sequence reactive current is decreased at a higher rate than the negative-sequence reactive current and superimposed positive-sequence reactive currents are greater than superimposed negative-sequence reactive currents.

In yet another case of the method, scaling down each of the positive-sequence and negative-sequence reactive currents comprises non-uniform scaling where the negative-sequence current is prioritized to be decreased before the positive-sequence current.

In yet another case of the method, scaling down each of the positive-sequence and negative-sequence reactive currents comprises non-uniform scaling where the positive-sequence current is prioritized to be decreased before the negative-sequence current.

In yet another case of the method, scaling down each of the positive-sequence and negative-sequence reactive currents comprises non-uniform scaling using optimization, where the negative-sequence current is prioritized to be decreased before the positive-sequence current.

In yet another case of the method, scaling down each of the positive-sequence and negative-sequence reactive currents comprises non-uniform scaling using optimization, where the positive-sequence current is prioritized to be decreased before the negative-sequence current.

In another aspect, there is provided a system for determining active and reactive currents during asymmetrical low-voltage ride through (LVRT) conditions at an inverter, the system comprising a processing unit in communication with a non-transitory computer-readable medium comprising instructions to cause the processing unit to execute: receiving of an indication of an LVRT condition; where there is an active current such that the largest phase current magnitude does not exceed a phase current limit, determining a maximum active current for associated positive-sequence and negative-sequence reactive currents by determining a largest active current magnitude; where there is an active current such that the largest phase current magnitude does not exceed the phase current limit, outputting the largest active current and associated positive-sequence and negative-sequence reactive currents to the inverter; where there is no active current such that the largest phase current magnitude does not exceed the phase current limit, scaling down each of the positive-sequence and negative-sequence reactive currents, or superimposed positive-sequence and negative-sequence reactive currents, to determine revised positive-sequence and negative-sequence reactive currents; where there is no active current such that the largest phase current magnitude does not exceed the phase current limit and a β condition for each phase after the scaling down is within a predetermined range, determining a non-zero positive-sequence revised active current where the magnitudes of all of the phase currents are below the phase current limit, the β condition based on a negative voltage angle ($\theta_{V^-}$) and a positive voltage angle ($\theta_{V^+}$); and output the revised active currents and the revised positive-sequence and negative-sequence reactive currents to the inverter.

In a particular case of the system, determining whether there is an active current such that the largest phase current magnitude does not exceed a phase current limit comprises determining a maximum active current by determining ranges for the active current such that each phase current does not exceed the phase current limit and selecting the upper bound of the range.

In another case of the system, the β condition equals $\pi+\theta_{V^-}-\theta_{V^+}$, and wherein the predetermined range is $180°<\beta<360°$ if the phase current of an A-phase is equal to the phase current limit after the scaling down, the predetermined range is $180°<\beta-120°<360°$ if the phase current of a B-phase is equal to the phase current limit after the scaling down, or the predetermined range is $180°<\beta+120°<360°$ if the phase current of a C-phase is equal to the phase current limit after the scaling down.

In yet another case of the system, scaling down each of the positive-sequence and negative-sequence reactive currents comprises uniformly scaling based on a change in the positive-sequence and negative-sequence reactive currents.

In yet another case of the system, scaling down each of the positive-sequence and negative-sequence reactive currents comprises uniformly scaling by determining a scaling factor that causes at least one of the phase currents equal to the phase current limit.

In yet another case of the system, determining the scaling factor comprises performing: determining all of the possible solutions for the scaling factor using a quadratic relationship to the phase current limit; discarding any solutions to the scaling factor that are outside of the [0,1] range; and selecting a largest solution to the scaling factor that makes at least one of the phases equal to or below the phase current limit and the other phases below the phase current limit.

In yet another case of the system, the quadratic relationship comprises the scaling factor (ρ) related to the phase current limit ($I_{max}$) by $I_{max}^2=\lambda_{2\varphi}\rho^2+\lambda_{1\varphi}\rho+\lambda_{0\varphi}$, where coefficients $\lambda_{2\varphi}$, $\lambda_{1\varphi}$, and $\lambda_{0\varphi}$, are related to parameters of superimposed reactive currents, pre-fault positive-sequence reactive currents, and capacitor reactive currents.

In yet another case of the system, determining the non-zero positive-sequence revised active current comprises determining a magnitude of an active current that satisfies the relationship of $|I_\varphi|=I_{max}=\sqrt{|I_x|^2+|I_y|^2}$, where $I_x$ comprises the positive-sequence reactive current ($I_Q^+$) and the angle between the positive-sequence reactive current and either the negative-sequence reactive current (β), the negative-sequence reactive current (β) minus $2\pi/3$, or the negative-sequence reactive current (β) plus $2\pi/3$, and $I_y$ comprises the negative-sequence reactive current ($I_Q^-$) and the angle between the positive-sequence reactive current and either the negative-sequence reactive current (β), the negative-sequence reactive current (β) minus $2\pi/3$, or the negative-sequence reactive current (β) plus $2\pi/3$ In yet another case of the system, where the A-phase is the largest active phase current, the $I_x$ equals ($|I_Q^+|+|I_Q^-|\cos \beta)\angle(\theta_{V^+}-\pi/2)$ and the $I_y$ equals ($|I_Q^-|\sin \beta)\angle\theta_{V^+}$, where the B-phase is the largest active phase current, the $I_x$ equals $$\left(|I_Q^+|+|I_Q^-|\cos\left(\beta-\frac{2\pi}{3}\right)\right)\angle\left(\theta_{V^+}-\frac{\pi}{2}\right)$$

and the $I_y$ equals $$\left(|I_Q^-|\sin\left(\beta-\frac{2\pi}{3}\right)\right)\angle\theta_{V^+},$$

and where the C-phase is the largest active phase current, the $I_x$ equals $$\left(|I_Q^+|+|I_Q^-|\cos\left(\beta+\frac{2\pi}{3}\right)\right)\angle\left(\theta_{V^+}-\frac{\pi}{2}\right)$$

and the $I_y$ equals $$\left(\left|I_Q^-\right|\sin\left(\beta+\frac{2\pi}{3}\right)\right)\angle\theta_{V^+},$$

$\theta_{V^+}$ denoting a voltage angle.

In yet another case of the system, determining the non-zero positive-sequence revised active current such that the current of the A-phase is below the phase current limit comprises the magnitude of the active phase current limited to $-2|I_Q^-|\sin \beta$, such that the current of the B-phase is below the phase current limit comprises the magnitude of the active phase current limited to $$-2|I_Q^-|\sin\left(\beta-\frac{2\pi}{3}\right),$$

and such that the current of the C-phase is below the phase current limit comprises the magnitude of the active phase current limited to $$-2|I_Q^-|\sin\left(\beta+\frac{2\pi}{3}\right).$$

In yet another case of the system, scaling down each of the positive-sequence and negative-sequence reactive currents comprises non-uniform scaling where the negative-sequence reactive current is decreased at a higher rate than the positive-sequence reactive current.

In yet another case of the system, scaling down each of the positive-sequence and negative-sequence reactive currents comprises non-uniform scaling where the positive-sequence reactive current is decreased at a higher rate than the negative-sequence reactive current.

In yet another case of the system, scaling down each of the positive-sequence and negative-sequence reactive currents comprises non-uniform scaling where the positive-sequence reactive current is decreased at a higher rate than the negative-sequence reactive current and superimposed positive-sequence reactive currents are greater than superimposed negative-sequence reactive currents.

In yet another case of the system, scaling down each of the positive-sequence and negative-sequence reactive currents comprises non-uniform scaling using optimization, where the negative-sequence reactive current is decreased at a higher rate than the positive-sequence reactive current.

In yet another case of the system, scaling down each of the positive-sequence and negative-sequence reactive currents comprises non-uniform scaling using optimization, where the positive-sequence reactive current is decreased at a higher rate than the negative-sequence reactive current.

In yet another case of the system, scaling down each of the positive-sequence and negative-sequence reactive currents comprises non-uniform scaling using optimization, where the positive-sequence reactive current is decreased at a higher rate than the negative-sequence reactive current and superimposed positive-sequence reactive currents are greater than superimposed negative-sequence reactive currents.

In yet another case of the system, scaling down each of the positive-sequence and negative-sequence reactive currents comprises non-uniform scaling where the negative-sequence current is prioritized to be decreased before the positive-sequence current.

In yet another case of the system, scaling down each of the positive-sequence and negative-sequence reactive currents comprises non-uniform scaling where the positive-sequence current is prioritized to be decreased before the negative-sequence current.

In yet another case of the system, scaling down each of the positive-sequence and negative-sequence reactive currents comprises non-uniform scaling using optimization, where the negative-sequence current is prioritized to be decreased before the positive-sequence current.

In yet another case of the system, scaling down each of the positive-sequence and negative-sequence reactive currents comprises non-uniform scaling using optimization, where the positive-sequence current is prioritized to be decreased before the negative-sequence current.

In another aspect, there is provided a method for determining active and reactive currents during asymmetrical low-voltage ride through (LVRT) conditions at an inverter, the method executable on a controller or executed as a model on a computer, the method comprising: receiving an indication of an LVRT condition; and capping the positive-sequence and negative-sequence reactive currents at pre-specified limits and outputting the capped positive-sequence and negative-sequence reactive currents to the inverter, and determining a maximum active current for associated positive-sequence and negative-sequence reactive currents by determining a largest active current magnitude and outputting the largest active current and associated positive-sequence and negative-sequence reactive currents to the inverter.

These and other aspects are contemplated and described herein. It will be appreciated that the foregoing summary sets out representative aspects of the system and method to assist skilled readers in understanding the following detailed description.

DESCRIPTION OF THE DRAWINGS

A greater understanding of the embodiments will be had with reference to the Figures, in which:

FIG. 3A shows active and reactive sequence current magnitudes, FIG. 3B shows instantaneous currents, and FIG. 3C shows sequence current angles;

FIG. 4A shows active and reactive sequence current magnitudes, FIG. 4B shows instantaneous currents, and FIG. 4C shows sequence current angles;

FIG. 5A shows below the limit although injecting $|I_p^+|$ and FIG. 5B shows above the limit when injecting $|I_p^+|$;

FIG. 9A shows angles of the sequence voltages, FIG. 9B shows active and reactive sequence current magnitudes at a point of connection (POC), and FIG. 9C shows instantaneous currents of the switches;

FIG. 10A shows the condition of $0 \leq \beta \leq \pi$ and FIG. 10B shows the condition of $\pi < \beta < 2\pi$;

FIG. 11A shows angles of the sequence voltages, FIG. 11B shows active and reactive sequence current magnitudes, and FIG. 11C shows instantaneous currents;

FIG. 12A shows active and reactive sequence current magnitudes, FIG. 12B shows instantaneous currents, and FIG. 12C shows angles of the sequence currents;

FIG. 13A shows angles of the sequence voltages, FIG. 13B shows active and reactive sequence current magnitudes, and FIG. 13C shows instantaneous currents;

FIG. 15A shows active and reactive sequence current magnitudes, FIG. 15B shows instantaneous currents, and FIG. 15C shows angles of the sequence voltages;

FIG. 16A shows active and reactive sequence current magnitudes and FIG. 16B shows instantaneous currents;

FIG. 16A shows active and reactive sequence current magnitudes and FIG. 16B shows instantaneous currents;

DETAILED DESCRIPTION

Figure 1:
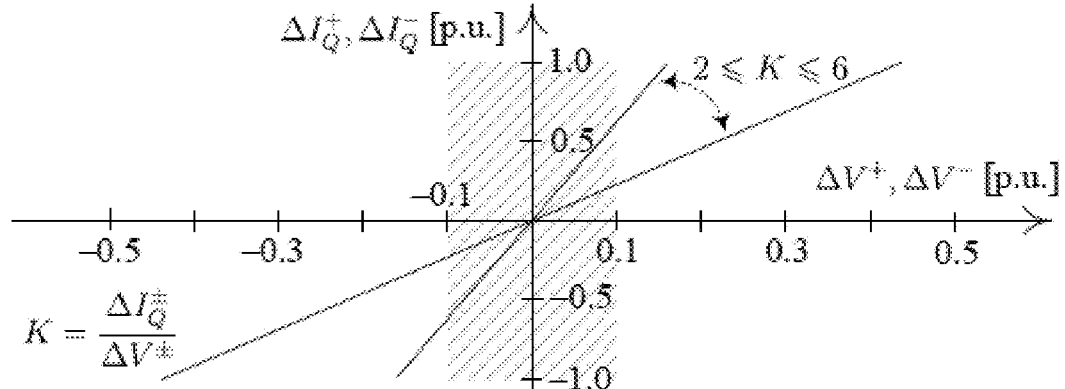
FIG. 1 shows an example of low-voltage ride through (LVRT) current requirements for modern grid codes.

For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practised without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender. Further definitions for terms may be set out herein; these may apply to prior and subsequent instances of those terms, as will be understood from a reading of the present description.

Any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Further, unless the context clearly indicates otherwise, any processor or controller set out herein may be implemented as a singular processor or as a plurality of processors. The plurality of processors may be arrayed or distributed, and any processing function referred to herein may be carried out by one or by a plurality of processors, even though a single processor may be exemplified. Any method, application or module herein described may be implemented using computer readable/executable instructions that may be stored or otherwise held by such computer readable media and executed by the one or more processors.

Generally, implementations of the requirements for generation of the negative-sequence current for inverters during LVRT have not considered the requirements with the same hierarchy. For example, currents may not ensure full utilization of the IBR's phase current capacity under all LVRT conditions. In addition, $\Delta I_Q^+$ and $\Delta I_Q^-$ are not necessarily prioritized over $I_p^+$. As another example, some schemes violate the GCs by generating active negative-sequence current, $I_p^-$.

Generally, conventional inverter design follows the following approach: the inverter attempts to meet a requirement for current, for example as shown in FIG. 1, and if the phase currents hit the limit, the sequence reactive currents are reduced to bring the phase currents back to the acceptable range. Under this condition, $I_p^+$ would be considered zero. Conversely, if meeting the requirement shown in FIG. 1 does not violate the phase current limit, a difference between the inverter's current limit and the scalar sum of the positive- and negative-sequence currents is used to generate $I_p^+$ using the intuitive relations, which will be described herein. The present inventors determined that this approach does not necessarily utilize the total current capacity of an inverter-based resource (IBR); which is the ultimate objective of the LVRT provision.

The present embodiments provide an approach to advantageously maximize the active current of an IBR while the reactive current requirements are met. Moreover, if the phase currents hit the limit due to large superimposed reactive currents $\Delta I_Q^\pm$ shown by FIG. 1, and so $\Delta I_Q^\pm$ must be reduced, the extent of reduction offered by the approach of the present embodiments is equal to or less than that given by other approaches; hence, maximizing the reactive currents as well. Advantageously, the approach of the present embodiments can provide a significant increase in the power generated by the IBRs that meet GCs. Generally, the LVRT mode is not activated while the system is operating inside the shaded area of FIG. 1; however, exact criteria for activating the LVRT mode can use any suitable criteria as different grid codes and standards may use different criteria for activating the LVRT mode.

In an example, the LVRT mode can be engaged when one or more phase to phase voltages are outside of a static voltage range and/or there is a sudden change in voltage. In this example, the LVRT mode can be deactivated when all the phase to phase voltages are in the static voltage range or after five seconds if the sudden voltage change did not result in any voltage exceeding the static voltage range. The sudden voltage jump can be defined by an absolute difference between an actual value of the positive and negative sequence voltage and a 50 period average of the positive and negative sequence voltage relative to a declared voltage.

As described herein, the present inventors conducted example experiments to verify the effectiveness and advantages of the present embodiments. In the example experiments, PSCAD/EMTDC simulations were conducted of a modified version of the IEEE 39-bus system, depicted in the test system of FIG. 2, were used. The modifications included the addition of 16 inverter-based resources (IBR) 150, enumerated IBR-1 to IBR-16, to represent a grid with high penetration of renewable sources. The high number of IBRs also makes the impact of GC requirements more visible from a system-wide perspective. For the sake of simplicity, all IBRs were rated at 34.5 kV, 200 MW, and interfaced to the grid through 250-MVA, 230-kV/34.5-kV, YGd1 transformers. The winding and vector group of the interface transformer may vary with respect to various voltage levels and utility standards (e.g. YGyg). The phase current limit of all IBRs was $I_{max}$=1.2 pu.

Common approaches used to determine the reference for the positive-sequence active current of an IBR that generates negative-sequence current have substantial limitations. When the reactive current is prioritized, a straightforward way to derive the reference for $|I_p^+|$ is based on Equation (1), which maintains the scalar sum of the positive- and negative-sequence current magnitudes below the phase current limit of the IBR:

$$|I^+| + |I^-| = \sqrt{|I_P^+|^2 + |I_Q^+|^2} + \sqrt{|I_P^-|^2 + |I_Q^-|^2} \le I_{max} \quad (1)$$

$|I_p^-|$ is zero or very small in comparison to $|I_Q^-|$, so the only unknown in Equation (1) is $|I_p^+|$. The following case studies evaluate the performance of this approach:

Case 1:

Example Case 1 elaborates on the effective utilization of an IBR's current capacity when the superimposed reactive currents $\Delta I_Q^+$ and $\Delta I_Q^-$ given by FIG. 1 do not make the phase currents hit their limit. Consider IBR-4 of FIG. 2 during a bolted phase-B-to-phase-C (BC) fault at bus B27 at t=1 s. The IBR's pre-fault current is 1 pu. The power factor is 1 at the point of measurement (POM), which is the high-voltage (HV) side of the main transformer. The diagram of FIG. 1 is applied on the low-voltage (LV) side of the IBR's interface transformer, referred to as the point of connection (POC). Before the fault, $|I_Q^+|$=0.037 pu (capacitive) and $|I_Q^-|$=0 at the POC. Once the fault happens, $V^+$ and $V^-$ at the POC change by −0.192 pu and 0.177 pu, respectively. Thus, $\Delta I_Q^+$=−0.480 pu and $\Delta I_Q^-$=0.442 pu for K=2.5, resulting in $|I_Q^+|$=0.52 pu and $|I_Q^-|$=0.44 pu. Using these reactive currents and $I_{max}$=1.2 pu, the maximum $|I_p^+|$ given by Equation (1) is 0.55 pu. These reference currents are met by the IBR quickly after the fault inception in FIG. 3A. These measurements are taken from before the LC filter's shunt capacitor to focus only on the current of the inverter switches (although the capacitor's current is comparatively insignificant).

Figure 3A:
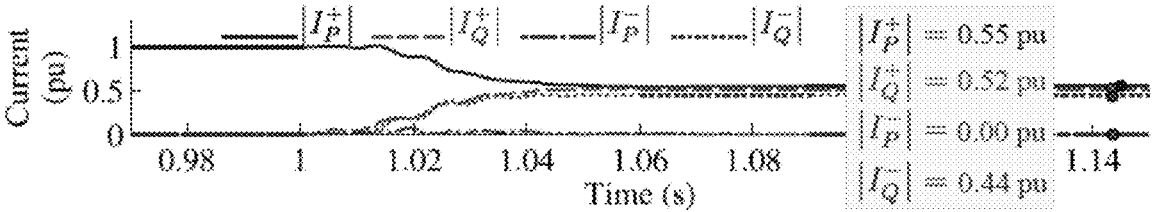
FIGS. 3A to 3C show measurements for IBR-4 in a first example case, where
Figure 3B:
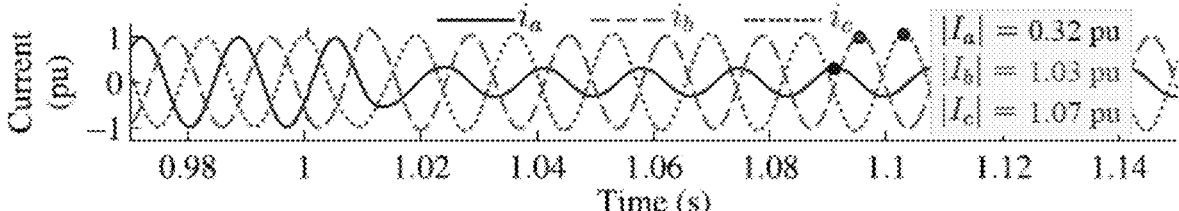
Figure 3C:
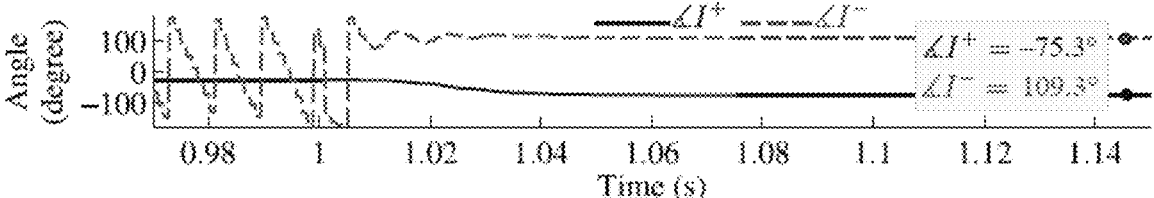

The phase currents resulting from the above sequence currents are displayed in FIG. 3B. The maximum current is $|I_c|$=1.07 pu, i.e., 65% of the IBR's 0.2-pu extra capacity for the LVRT current remains untapped. For phase B, 85% of this excess capacity remains unused. For phase A, this capacity is not used at all. This unused capacity stems from the scalar sum of Equation (1), which is different from the vector sum that actually determines the phase currents. The underlying assumption of Equation (1) is that $I^+$ and $I^-$ are in phase. This assumption is invalid for most fault conditions, including the above fault (as exemplified in FIG. 3C). The 184.6° phase difference in FIG. 3C makes the vector sum of $I^+$ and $I^-$ smaller than the scalar sum in Equation (1), hence the inefficient utilization of the inverter's current capacity.

Since the maximum phase current, $|I_c|$, is 0.13 pu less than $I_{max}$, one might expect that $|I_p^+|$ can be increased by at most 0.13 pu, and then the inverter's capacity is fully utilized. However, increasing $|I_p^+|$ by 0.13 pu while $|I_Q^+|$ and $|I_Q^-|$ are kept the same as in FIG. 3A results in $|I_a|$=0.41 pu, $|I_b|$=1.15 pu, $|I_c|$=1.13 pu. These currents are still below the IBR's phase current limit. Here again, identification of reference currents based on scalar calculations causes the undesired result.

Although GCs generally prioritize the reactive power, they also generally require maximizing active power. This is critical in maintaining the load-generation balance; i.e., the ultimate objective of the LVRT requirement. Effective utilization of the seemingly small 0.2-pu excess current capacity of the inverter in the phase domain offers sizable active power in the sequence domain. This can be made clear only when the excess current capacity is maximally used, as described herein.

Figure 4A:
FIGS. 4A to 4C show example measurements for IBR-16 in a second example case, where
Figure 4B:
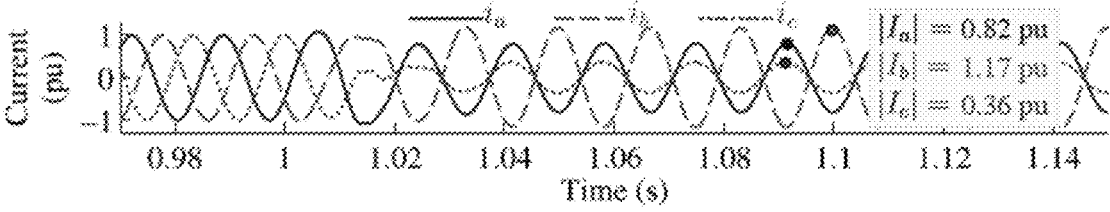
Figure 4C:
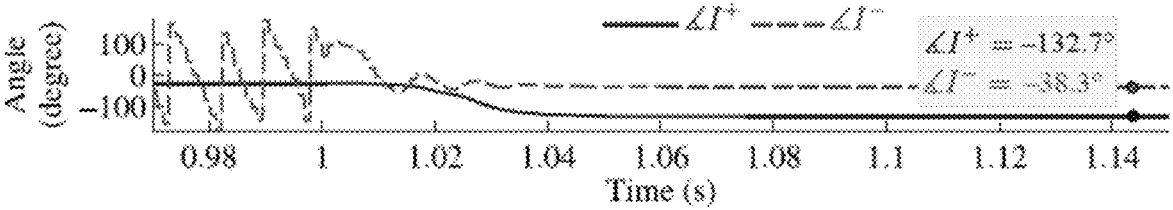

Case 2:

Example Case 2 focuses on when the superimposed reactive currents $\Delta I_Q^+$ and $\Delta I_Q^-$ given by FIG. 1 make the phase currents hit their limit (which did not happen in Case 1). Consider IBR-16 when a phase-A-to-ground (AG) fault with $R_f$=5Ω occurs at bus B7. For the pre-fault $|I_{Q-pre}^+|$=0.038 pu (capacitive), $\Delta V^+$=−0.136 pu, and $\Delta V^-$=0.136 pu, the superimposed currents given for K=5 by FIG. 1 yield $|I_Q^+|$=0.72 pu and $|I_Q^-|$=0.68 pu. GCs generally permit lowering the active current to create room for these large reactive currents. However, even with zero active current, the reactive currents add up to 1.40 pu, violating the inequality in Equation (1). Therefore, $|I_Q^+|$ and $|I_Q^-|$ are uniformly scaled down. The scaling factor that makes $|I_Q^+|$ and $|I_Q^-|$ satisfy Equation (1) is obtained by dividing the right side of Equation (1) over 1.40 pu; i.e., $I_{max}$/1.40=0.857. This would satisfy Equation (1) by scaling down the reactive currents to their supposedly maximum values of $|I_Q^+|$=0.62 pu and $|I_Q^-|$=0.58 pu, which add up to 1.2 pu. Under this condition, it appears that the severity of the voltage drop has made the reactive currents required by the GC so large that no room is left to generate active current. These sequence currents, shown in FIG. 4A, lead to the phase currents of FIG. 4B. Phase B carries the largest current and is 0.03 pu less than $I_{max}$. FIGS. 4A to 4C show example measurements for IBR-16 in case 2, where FIG. 4A shows active and reactive sequence current magnitudes, FIG. 4B shows instantaneous currents, and FIG. 4C shows sequence current angles.

One obvious problem of the above process is that the 0.857 scaling factor obtained using Equation (1) prevents maximizing the reactive currents, and so 15% of the inverter's excess current capacity remains unused. If $|I_Q^+|$ and $|I_Q^-|$ were scaled down by a factor of 0.879 to 0.63 pu and 0.60 pu, respectively, then the current of phase C would reach to 1.2 pu. This would satisfy the IBR's phase current limit, even though it violates Equation (1).

Figure 5A:
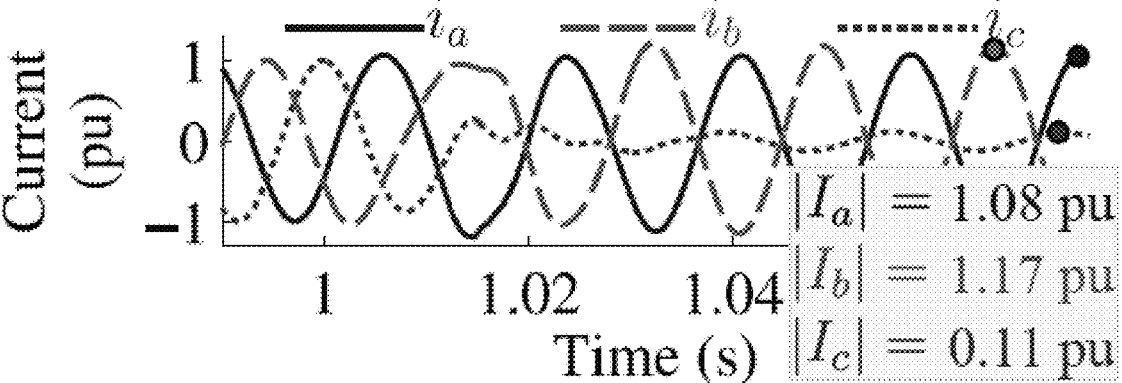
FIGS. 5A and 5B show instantaneous phase currents of IBR-16 in example case 2, where
Figure 5B:
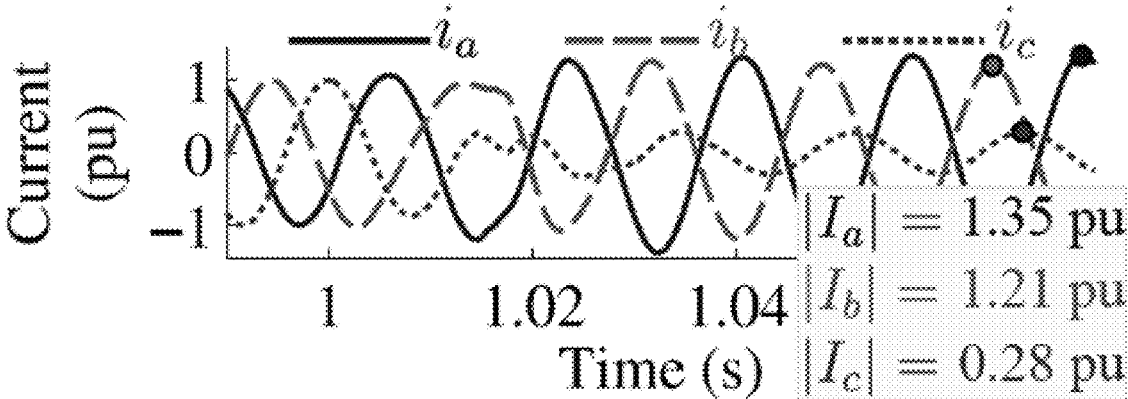

The second (and more substantial) problem is not as obvious. It is taken for granted that once 0.879 is used to scale down $|I_Q^+|$ and $|I_Q^-|$ to 0.63 pu and 0.60 pu, and the phase C current hits the limit, no room is left to generate $|I_p^+|$. However, as shown in FIG. 5A, the addition of a randomly chosen $|I_p^+|$=0.3 pu (which amounts to 51.7 MW of active power) to $|I_Q^+|$=0.63 pu and $|I_Q^-|$=0.60 pu actually decreases the maximum phase current from 1.2 pu by 0.03 pu. Generation of another randomly chosen $|I_p^+|$=0.6 pu, however, makes $I_a$ and $I_b$ larger than the limit (as illustrated in FIG. 5B). For such conditions, there is no commonly available solution to maximize $|I_p^+|$ without violating the phase current limit. FIGS. 5A and 5B show instantaneous phase currents of IBR-16 in case 2, where FIG. 5A shows below the limit although injecting $|I_p^+|$ and FIG. 5B shows above the limit when injecting $|I_p^+|$.

Figure 6:
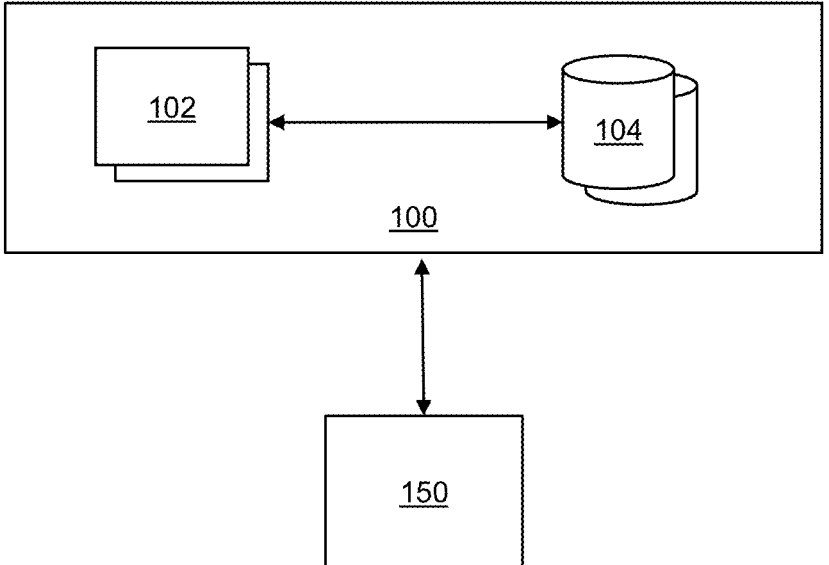
FIG. 6 shows a block diagram for a system for determining active and reactive currents during asymmetrical LVRT conditions, according to an embodiment.

Turning to FIG. 6, shown is a diagram for a system 100 for determining active and reactive currents during asymmetrical LVRT conditions, according to an embodiment. The system 100 is connectable to provide instructions to an inverter 150 (also referred to as an inverter-based resource (IBR)) associated with further electrical power circuitry, such as solar power generator circuitry. In some cases, the system 100 is connectable to one or more IBRs. The system 100 includes one or more processing units 102 in communication with one or more memory units 104, each memory unit 104 comprising a non-transitory computer-readable medium. The processing units 102 can comprise microprocessors, microcontrollers, dedicated hardware circuits, or the like. The system 100 can interface with each IBR 150, via interfacing with an interface transformer of the inverter 150, at the POC. The processing unit 102 executes instructions stored on the one or more memory units 104 to perform a number of steps, as described herein. The system may include other components as applicable or suitable, such as a local bus enabling the one or more processing units 102 to communicate with one or more memory units 104. In some cases, the system 100 can interface with the user, for example with a display and input device. In some cases, the system 100 can also interface with other systems, for example computing devices and servers remotely located from the system 100, such as for a typical cloud-based access model.

Figure 7:
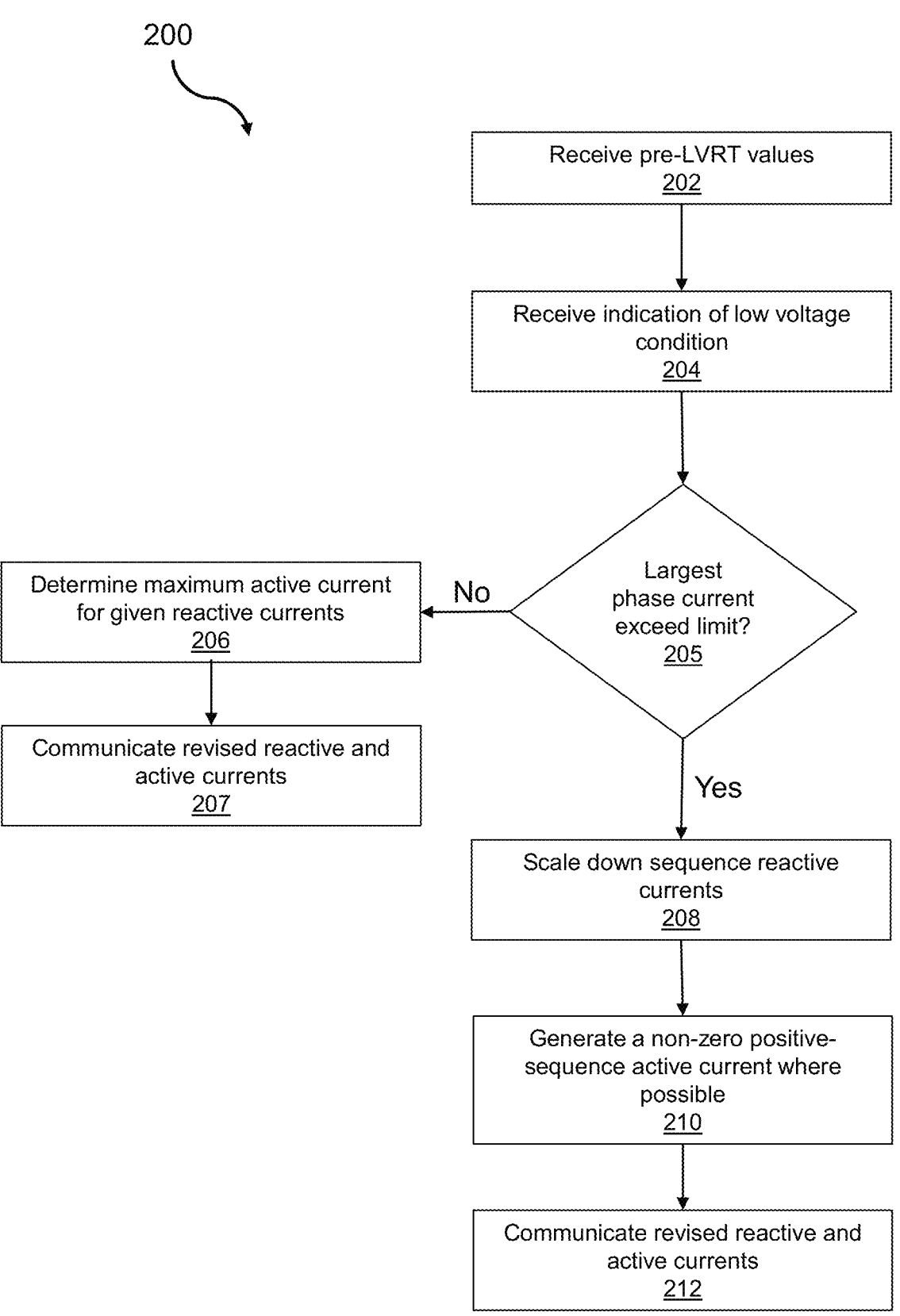
FIG. 7 shows a diagrammatic flowchart for a method for determining active and reactive currents during asymmetrical LVRT conditions, according to an embodiment.

The system 100 executes a method that complies with the requirement to maximize an IBR's active current during LVRT while the requirements of applicable grid codes (for example, as outlined in the diagram of FIG. 1) are adhered to. While the present disclosure refers to certain grid codes, it is understood that the present embodiments can be used to meet the applicable requirements of various grid codes, standards (e.g., the IEEE P2800), interconnection agreements, or the like. Turning to FIG. 7, shown therein is a method for 200 for determining active and reactive currents during asymmetrical LVRT conditions, according to an embodiment.

At block 202, the processing unit 102 receives pre-LVRT quantities values for the currents from respective current sensors associated with the inverter.

At block 204, the processing unit 102 receives an indication of an LVRT condition. Determination of LVRT conditions can vary depending on a given GC. For example, in the Verband der Elektrotechnik, Elektronik und Informationstechnik e.V. (VDE) code, one of the following two events are specified as the criterion for the start of the LVRT condition:

A sudden change in voltage compared to the average voltage in the 50 pre-fault voltage periods; or Voltage>1.1 $U_{MS}$ or <0.9 $U_{MS}$, where $U_{MS}$ is an operating voltage of the medium-voltage network, to which the voltage regulator of the High-Voltage/Medium-Voltage transformer regulates on the medium voltage side.

Additionally, the criteria for the LVRT condition ending is either:

5 s after fault start; or

Restoration of all line-to-line voltages in the range of 0.9 UMS<U<1.1 UMS.

In another example, under the Institute of Electrical and Electronics Engineers (IEEE) P2800 standard, except for 500 kV nominal voltage, the continuous operating region is when the applicable voltage is ≥0.9 per unit and ≤1.05 per unit. For 500 kV nominal voltage, the continuous operating range is when the applicable voltage is ≥0.9 per unit and ≤1.10 per unit. During temporary low voltage disturbances, the applicable voltage is defined as the lowest magnitude fundamental frequency phasor component phase-phase or phase-ground voltage at the RPA relative to the corresponding nominal system voltage. According to the standard, LVRT can be defined as when the applicable voltage drops below 0.9 pu.

At block 205, the processing unit 102 determines whether the largest phase current magnitude exceeds a phase current limit.

At block 206, where the largest phase current magnitude $I_{max}$ does not exceed a phase current limit, the processing unit 102 determines a maximum active current for the given reactive currents. Generally, inverters have an applicable limit for their phase current to prevent damage to power electronic switches and other componentry. In many cases, this phase current limit is between 100% to 200% of the inverter's rated current. In some cases, this limit can be time-variant; for example, the phase current limit can be 160% of the rated current during the first 20 milliseconds of LVRT and decrease to 120% of the rated current for the remainder of the LVRT period. While the present disclosure generally refers to a time-invariant phase current limit, it is understood that this limit can be time-dependent.

The relation between the different components of an IBR's sequence currents and the phase currents that flow through the inverter switches is shown in Equation (2); where $\alpha = e^{j2\pi/3}$; $\theta_V$ denotes the voltage angle at the POC; pre in the subscript denotes the pre-LVRT quantities; and cap indicates the quantities associated with the shunt capacitor of the inverter's filter.

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix} \Bigg[ \left| \pm |I_{Q-pre}^+| + \Delta I_Q^+ \right| \angle \left( \theta_{V^+} - \frac{\pi}{2} \right) + \\ \left| I_{Q-cap}^+ \right| \angle \left( \theta_{V^+} + \frac{\pi}{2} \right) + |I_P^+| \angle (\theta_{V^+}) \Delta I_Q^- \angle \left( \theta_{V^-} + \frac{\pi}{2} \right) + \left| I_{Q-cap}^- \right| \angle \theta_{V^-} + \frac{\pi}{2} \Bigg]$$

(2)

From Equation (2), the phase currents can be written as:

$$I_\Phi = |I_Q^+| \angle \left( \theta_{V^+} - \frac{\pi}{2} + \varphi \right) + |I_P^+| \angle (\theta_{V^+} + \varphi) + |I_Q^-| \angle \left( \theta_{V^-} + \frac{\pi}{2} - \varphi \right)$$

(3)

where $\Phi \in \{a, b, c\}$, and $\varphi$ is 0, −2π3, and 2π3 for phases A, B, and C, respectively. The reactive components of $I_\Phi$, are derived using Equation (4), which includes $|\Delta I_Q^+|$ given by FIG. 1.

$$\left| I_Q^+ \right| = \left| \pm |I_{Q-pre}^+| + \Delta I_Q^+ \right| - \left| I_{Q-cap}^+ \right|$$

(4)

$$\left| I_Q^- \right| = \Delta I_Q^- + \left| I_{Q-cap}^- \right|$$

(5)

Figure 8:
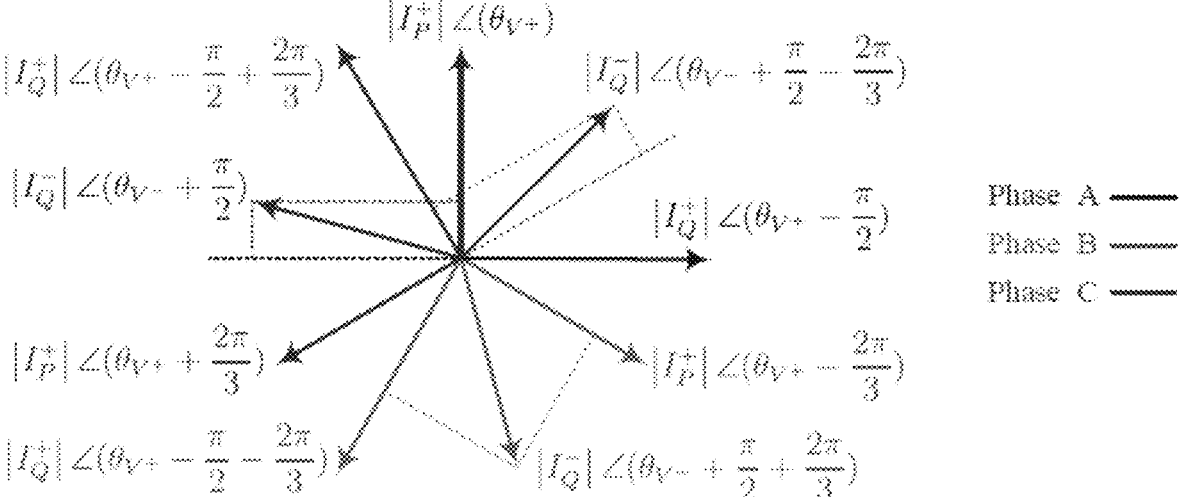
FIG. 8 illustrates an example vector diagram showing active and reactive sequence components of phase currents.

The processing unit 102 determines the active current $|I_p^+|$ in Equation (3) such that the largest phase current given by Equation (3) equals $I_{max}$. For each phase current, the first two of the three vectors on the right side of Equation (3), i.e., $|I_Q^+| \angle (\theta_{V^+} - \pi 2 + \varphi)$ and $|I_p^+| \angle (\theta_{V^+} + \varphi)$, are 90° out of phase. Thus, they can generate two orthogonal coordinate axes onto which the third vector, i.e., $|I_Q^-| \angle (\theta_{V^-} + \pi 2 - \varphi)$, can be projected. The vector diagram in FIG. 8, showing the active and reactive sequence components of phase currents, displays these three vector components for the three phase currents. This diagram demonstrates how the negative-sequence reactive current of each phase can be projected onto the two axes made by the positive-sequence active and reactive currents of the respective phase. By doing so, each phase current can be expressed as $$I_\Phi = |I_Q^+|\angle\left(\theta_{V^+} - \frac{\pi}{2} + \varphi\right) + |I_P^+|\angle(\theta_{V^+} + \varphi) + \tag{6}$$

$$|I_Q^-|\cos(\pi + \theta_{V^-} - \theta_{V^+} + \varphi)\angle\left(\theta_{V^+} - \frac{\pi}{2} + \varphi\right) +$$

$$|I_Q^-|\sin(\pi + \theta_{V^-} - \theta_{V^+} + \varphi)\angle(\theta_{V^+} + \varphi)$$

The square magnitudes of the phase currents in Equation (6) are:

$$|I_\Phi|^2 = \left(|I_Q^+| + |I_Q^-|\cos(\beta + \varphi)\right)^2 + \left(|I_P^+| + |I_Q^-|\sin(\beta + \varphi)\right)^2 \tag{7}$$

where $$\beta = \pi + \theta_{V^-} - \theta_{V^+} \tag{8}$$

The IBR limit for the three phase currents can be expressed as the three inequalities embedded in Equation (9) for different values of φ.

$$|I_\Phi|^2 = \left(|I_Q^+| + |I_Q^-|\cos(\beta + \varphi)\right)^2 + \left(|I_P^+| + |I_Q^-|\sin(\beta + \varphi)\right)^2 \leq I_{max}^2 \tag{9}$$

In Equation (9), $|I_Q^+|$ and $|I_Q^-|$ are given by FIG. 1, and $|I_p^+|$ is the unknown. Solving these three inequalities yields three different ranges for $|I_p^+|$, each making the corresponding phase current less than $I_{max}$. To maintain all phase currents below $I_{max}$, the three inequalities must hold simultaneously. Thus, only the intersection of the three ranges is acceptable for $|I_p^+|$, resulting in Equation (10). In this relation, the first range stands for the obvious fact that $|I_p^+|\geq 0$. The second, third, and fourth ranges are the solutions of Equation (9) for phases A, B, and C, respectively. If the intersection of the four ranges in Equation (10) is not an empty set, the maximum active current is the upper bound of this intersection. Under such conditions, the GC is satisfied using only Equation (10), and the further determines, described herein, are not needed.

$$|I_P^+| \in \left(\mathbb{R}^{\geq 0} \cap \left[-\sqrt{I_{max}^2 - \left(|I_Q^+| + |I_Q^-|\cos\beta\right)^2} - |I_Q^-|\sin\beta,\right.\right. \tag{10}$$

$$\sqrt{I_{max}^2 - \left(|I_Q^+| + |I_Q^-|\cos\beta\right)^2} - |I_Q^-|\sin\beta\left.\right]$$

$$\cap\left[-\sqrt{I_{max}^2 - \left(|I_Q^+| + |I_Q^-|\cos\left(\beta - \frac{2\pi}{3}\right)\right)^2} - |I_Q^-|\sin\left(\beta - \frac{2\pi}{3}\right),\right.$$

$$\sqrt{I_{max}^2 - \left(|I_Q^+| + |I_Q^-|\cos\left(\beta - \frac{2\pi}{3}\right)\right)^2} - |I_Q^-|\sin\left(\beta - \frac{2\pi}{3}\right)\left.\right]$$

$$\cap\left[-\sqrt{I_{max}^2 - \left(|I_Q^+| + |I_Q^-|\cos\left(\beta + \frac{2\pi}{3}\right)\right)^2} - |I_Q^-|\sin\left(\beta + \frac{2\pi}{3}\right),\right.$$

$$\left.\left.\sqrt{I_{max}^2 - \left(|I_Q^+| + |I_Q^-|\cos\left(\beta + \frac{2\pi}{3}\right)\right)^2} - |I_Q^-|\sin\left(\beta + \frac{2\pi}{3}\right)\right]\right)$$

Figure 9A:
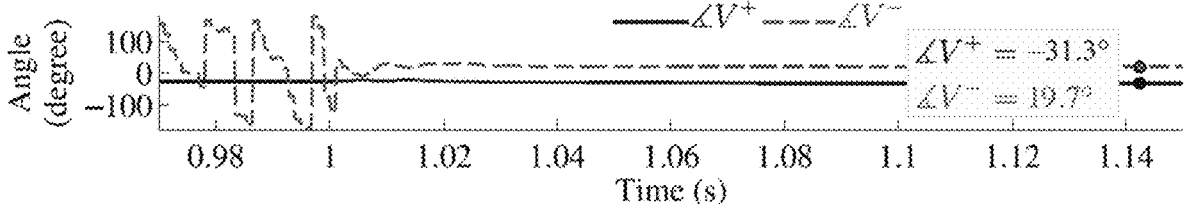
FIGS. 9A to 9C illustrate measurements for IBR-4 in the first example case when the first example case is repeated using the method of FIG. 7, where
Figure 9B:
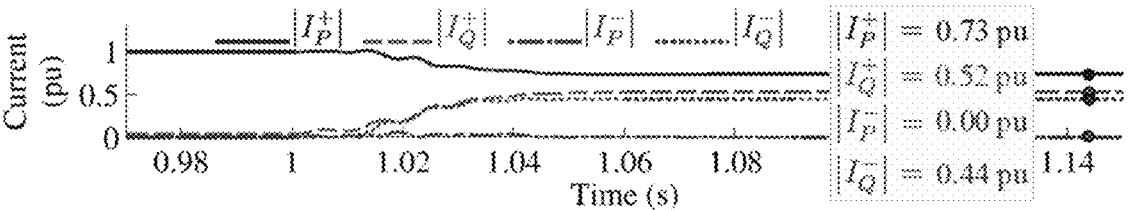
Figure 9C:
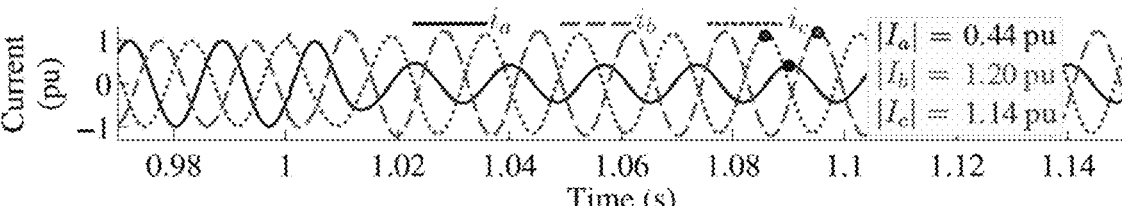

To show the difference made using the above approach, consider the fault of example Case 1 while the processing unit 102 with respect to IBR-4 uses Equation (10) to determine $|I_p^+|$. Using the angles of the sequence voltages shown in FIG. 9A, β=231°. Moreover, the LC filter's shunt capacitor generates $|I_{Q-cap}^+|$=0.031 pu and $|I_{Q-cap}^-|$=0.008 pu (not shown due to the space limitation). In addition, since there is no need to scale down the reactive currents and the fault conditions have not changed, $|I_Q^\pm|$ in FIG. 9B is similar to that in FIG. 3A. Substituting these values into Equation (4) and Equation (10), the second, third, and fourth range for $|I_p^+|$ in Equation (10) that correspond to phases A, B, and C are [−0.834, 1.531], [−1.574, 0.735], [−0.686, 0.828] pu, respectively. Thus, the maximum of the intersection of the four ranges in Equation (10) is $|I_p^+|$=0.735 pu, displayed in FIG. 9B. FIG. 9B illustrates active and reactive sequence current magnitudes at the POC. The sequence currents in this figure satisfy both FIG. 1 and the requirement to maximize the IBR's active current, leading to an additional 28.3 MW of active power compared to the example of FIGS. 3A to 3C. Furthermore, the phase currents through the inverter switches, depicted in FIG. 9C, do not violate their limit. FIG. 9C shows instantaneous currents of the switches.

In certain cases, there are conditions under which Equation (10) returns an empty set, and as such, there are approaches used by the processing unit 102 for these conditions to satisfy the GC. Generally, an inverter's maximum current is fairly small. In addition, when a fault is not very far from the IBR, and so the change in the voltage is significant, the reactive currents determined by FIG. 1 are quite large. The additional requirement for the negative-sequence current also increases the total reactive current by up to 100%. The small $I_{max}$ and large $I_Q^\pm$ make it likely that one or more of the terms under the six radicals in Equation (10) become negative. Since all of the equations from Equation (3) onwards are in the domain of real numbers, a negative term under even one radical in Equation (10) would yield an unacceptable result for $|I_p^+|$, i.e., $|I_p^+|\in\emptyset$. Even if all of the terms under the radicals in Equation (10) are positive, it is still possible that the four ranges in Equation (10) do not overlap, and $|I_p^+|\in\emptyset$. Under such conditions, at least one of the phase currents exceeds $I_{max}$, because otherwise solving Equation (9) and Equation (10) would give $|I_p^+|$=0, not $|I_p^+|\in\emptyset$.

At block 207, the processing unit 102 communicates the reactive currents and the active currents to the respective IBR 150.

At block 208, where the largest phase current magnitude $I_{max}$ exceeds a phase current limit, the processing unit 102 scales down the positive-sequence and negative-sequence reactive currents, or superimposed positive-sequence and negative-sequence reactive currents. In some cases, this scaling can be performed uniformly on both the positive-sequence and negative-sequence. In other cases, as described herein, the positive-sequence and negative-sequence can be scaled using other current limitation strategies, as described herein. In contrast, other approaches scale the total positive-sequence and negative-sequence reactive currents, $I_Q^\pm$. Thus, the formulations in these schemes include scaling the pre-fault current, $I_{Q-pre}$, and the current through the capacitor of the inverter's LC filter, $I_{Q-cap}$, neither of which is generally controllable during LVRT. Advantageously, in the present embodiments, the processing unit 102 provides for such current to be scaled.

When positive-sequence and negative-sequence reactive currents are not scaled down, the following relation holds as long as the same K-factor is used for the positive and negative sequence in FIG. 1:

$$\frac{\Delta I_Q^+}{\Delta I_Q^-} = \frac{\Delta V^+}{\Delta V^-} \tag{11}$$

Therefore, the IBR's equivalent impedances in the two sequence circuits are similar, replicating a synchronous generator. An IBR should ideally maintain the same relation after the currents are scaled down, so that the similarity with the synchronous generators is preserved. Scaling the total reactive currents violates Equation (10) since the total reactive currents are not limited to only the superimposed currents given by FIG. 1. Therefore, only $\Delta I_Q^{\pm}$ must be scaled down in the derivations that yield the scaling factor, p. To calculate this factor, $\Delta I_Q^{\pm}$ and $I_p^{+}$ in Equation (2) are set to $\rho\Delta I_Q^{\pm}$ and 0, respectively, resulting in:

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix} \begin{bmatrix} \left(|\pm|I_{Q-pre}^{+}|+\rho\Delta I_Q^{+}-|I_{Q-cap}^{+}|\right)\llcorner\left(\theta_{V^+}-\frac{\pi}{2}\right) \\ \left(\rho\Delta I_Q^{-}-|I_{Q-cap}^{-}|\right)\llcorner\left(\theta_{V^-}+\frac{\pi}{2}\right) \end{bmatrix} \quad (12)$$

$$I_{max}^2 = \left(|\pm|I_{Q-pre}^{+}|+\rho\Delta I_Q^{+}|-|I_{Q-cap}^{+}|\right)^2 + \left(\rho\Delta I_Q^{-}+|I_{Q-cap}^{-}|\right)^2 + \quad (13)$$
$$2\left(|\pm|I_{Q-pre}^{+}|+\rho\Delta I_Q^{+}|-|I_{Q-cap}^{+}|\right)\left(\rho\Delta I_Q^{-}+|I_{Q-cap}^{-}|\right)\cos(\beta+\varphi)$$

Equation (12) is solved for $\rho$ such that $\max\{|I_a|, |I_b|, |I_c|\}=I_{max}$ to ensure maximum utilization of the inverter's capacity. Equating the magnitude of phase currents given by Equation (12) with $I_{max}$ yields the three equations embedded in Equation (13) for $\varphi=0$, $-2\pi3$, and $+2\pi3$, corresponding to phases A, B, and C, respectively. This relation can be written with respect to $\rho$, as in:

$$I_{max}^2 = \lambda_{2\varphi}\rho^2 + \lambda_{1\varphi}\rho + \lambda_{0\varphi} \quad (14)$$

where the coefficients $\lambda_{2\varphi}$, $\lambda_{1\varphi}$, and $\lambda_{0\varphi}$, are expressed by Equation (15) in terms of the known parameters of Equation (13).

$$\lambda_{2\varphi} = \left(\Delta I_Q^{+}\right)^2 + 2\mu\Delta I_Q^{+}\Delta I_Q^{-}\cos(\beta+\varphi) + \left(\Delta I_Q^{-}\right)^2 \quad (15)$$
$$\lambda_{1\varphi} = 2\Delta I_Q^{+}|I_{Q-cap}^{+}| \pm 2\mu|I_{Q-pre}^{+}|\Delta I_Q^{+} + 2\Delta I_Q^{-}|I_{Q-cap}^{-}| +$$
$$\left(\mp 2\mu|I_{Q-pre}^{+}|\Delta I_Q^{-} + 2\mu\Delta I_Q^{+}|I_{Q-cap}^{-}| - 2|I_{Q-cap}^{+}|\Delta I_Q^{-}\right)\cos(\beta+\varphi)$$
$$\lambda_{0\varphi} = |I_{Q-pre}^{+}|^2 \pm 2\mu|I_{Q-pre}^{+}||I_{Q-cap}^{+}| + |I_{Q-cap}^{+}|^2 + |I_{Q-cap}^{-}|^2 +$$
$$\left(\mp 2\mu|I_{Q-pre}^{+}||I_{Q-cap}^{-}| - 2|I_{Q-cap}^{+}||I_{Q-cap}^{-}|\right)\cos(\beta+\varphi).$$

In Equation (15), if $I_{Q-pre}^{+}$ is capacitive, $\mu=-1$, and the upper sign must be used in $\pm$ and $\mp$. For an inductive $I_{Q-pre}^{+}$, however, the lower sign must be used in $\pm$ and $\mp$, and $\mu=-1$ when $|I_{Q-pre}^{+}|+\rho\Delta I_Q^{+}<0$, and $\mu=1$ when $|I_{Q-pre}^{+}|+\rho\Delta I_Q^{+}>0$. As $\rho$ is the unknown of Equation (14), the sign of $|I_{Q-pre}^{+}|+\rho\Delta I_Q^{+}$ cannot be determined before Equation (14) is solved. Thus, Equation (14) must be solved for both conditions, i.e., $|I_{Q-pre}^{+}|+\rho\Delta I_Q^{+}<0$ and $|I_{Q-pre}^{+}|+\rho\Delta I_Q^{+}>0$. For each of these inequalities, the calculated $\rho$ is acceptable if the respective inequality is held for that $\rho$.

To find an optimal $\rho$ that satisfies all of the constraints, the equation for each phase embedded in Equation (14) is solved independently of the other two equations in Equation (14) (for the other two phases) but the constraint on the current magnitude must be satisfied for all three phases. Therefore, the scaling factor can be found by, first, finding all of the possible solutions for $\rho$ in each equation embedded in Equation (14); then, discarding any $\rho$ that is outside the [0,1] range because such $\rho$'s do not scale down the current magnitude; then, choosing the largest $\rho$ that is the solution of Equation (14) for one of the phases but also simultaneously keeps the current magnitude in the other two phases below $I_{max}$.

Since Equation (12) was solved to satisfy the $\max\{|I_a|, |I_b|, |I_c|\}=I_{max}$ condition, the scaled-down positive- and negative-sequence reactive currents obtained above make the current of at least one phase equal to the inverter's limit. When one of the phase currents reaches the limit, generally, it has previously been assumed that the inverter has no room to inject active current. At block 210, the processing unit 102 can calculate a non-zero positive-sequence active current, $I_p^{+}$ to be generated by the IBR 150, while the reactive currents obtained above remain intact and the inverter's phase current limit is satisfied.

Assume, without loss of generality, that $|I_a|$ is the largest phase current when $I_Q^{\pm}$ is scaled down and no $I_p^{+}$ is generated, i.e.:

$$|I_a| = \left\| I_Q^{+}|\llcorner\left(\theta_{V^+}-\frac{\pi}{2}\right) + |I_Q^{-}|\llcorner\left(\theta_{V^-}+\frac{\pi}{2}\right)\right\| = I_{max} \quad (16)$$

Figure 10A:
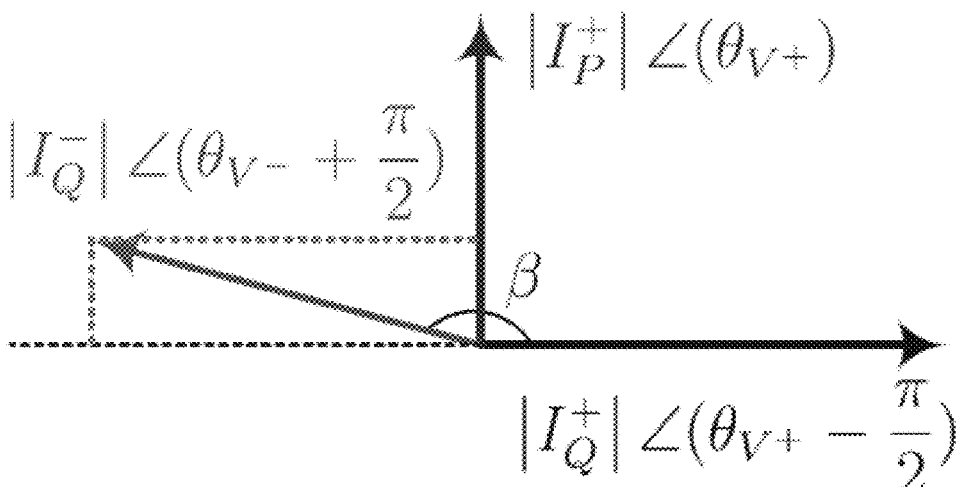
FIGS. 10A and 10B illustrate two possible situations for phase A sequence components, where

The angle between $I_Q^{+}$ and $I_Q^{-}$ in Equation (16) is $\Omega$ defined in Equation (8). Either $0\leq\beta\leq\pi$, as in FIG. 10A, or $\pi<\beta<2\pi$, as in FIG. 10B. The following analyzes both of the conditions in FIGS. 10A and 10B. When $I_p^{+}$ is not generated, by projecting $I_Q^{-}$ onto the axes made by $I_Q^{+}$ and its orthogonal axis (which is the axis of the respective $I_p^{+}$ if $I_p^{+}$ were generated), $|I_a|$ can be written as:

$$|I_a| = I_{max} = \sqrt{|I_x|^2 + |I_y|^2} \quad (17)$$

where:

$$I_x = \left(|I_Q^{+}| + |I_Q^{-}|\cos\beta\right)\llcorner\left(\theta_{V^+}-\frac{\pi}{2}\right) \quad (18)$$

$$I_y = \left(|I_Q^{-}|\sin\beta\right)\llcorner\theta_{V^+} \quad (19)$$

for FIG. 10A, in which $\sin\beta\geq0$, $I_y$ and $|I_p^{+}|\angle\theta_{V^+}$ are in phase. Therefore, generating any $|I_p^{+}|\angle\theta_{V^+}$ in this case increases $|I_y|$ and pushes $|I_a|$ beyond the $I_{max}$ limit considered in Equation (16). Thus, the processing unit 102 cannot generate $I_p^{+}$ when $0\leq\beta\leq\pi$.

Figure 10B:
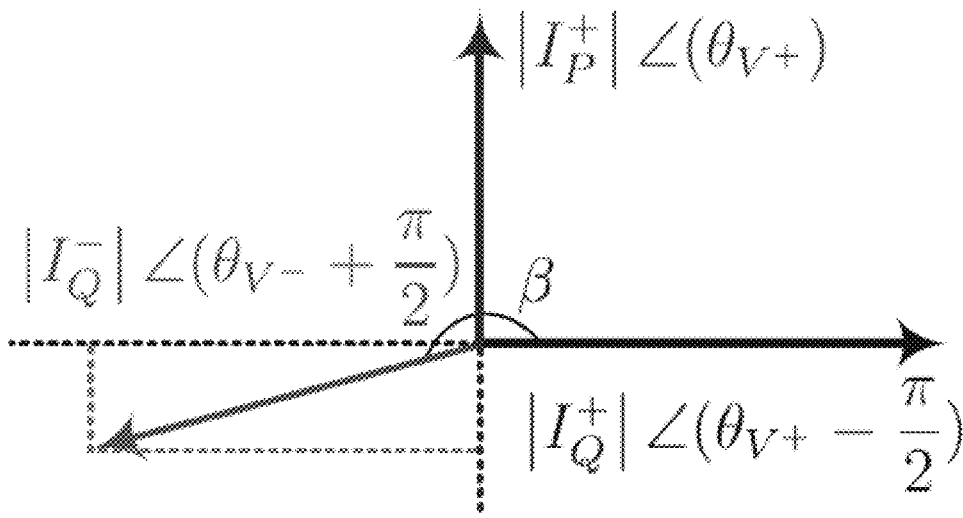

For $\pi\leq\beta\leq2\pi$ in FIG. 10B, however, $\sin\beta<0$, and so $I_y$ and $|I_p^{+}|\angle\theta_{V^+}$ are 180° out of phase. Thus, an active current as large as:

$$|I_p^{+}| = -2|I_Q^{-}|\sin\beta \quad (20)$$

can be determined by the processing unit 102. This would keep $|I_y|$ unchanged because for the $|I_p^{+}|$ given by Equation (20), $I_y=(|I_Q^{-}|\sin\beta-2|I_Q^{-}|\sin\beta)\angle\theta_{V^+}=-|I_Q^{-}|\sin\beta\angle\theta_{V^+}$. When $|I_y|$ and $|I_x|$ in Equation (15) do not change, $|I_a|$ is maintained at $I_{max}$. However, there is no guarantee that $I_b$ and $I_c$ remain below $I_{max}$ after injecting the $I_p^{+}$ given by Equation (20).

Although the above formulation does not ensure that $I_b$ and $I_c$ are less than $I_{max}$, it proves that Equation (10) can be used to determine the $|I_p^{+}|$ that can be generated after scaling down $I_Q^{\pm}$. Substituting the $I_{max}$ given by Equation (17) and Equation (8) into Equation (10) shows that the $|I_p^{+}|$ given by Equation (20) is the upper bound of the second range on the right side of Equation (10), which corresponded to phase A. It can be similarly shown that if the derivations in Equations

(16) to (20) are carried out for phases B and C (which would require only shifting $\beta$ by $+2\pi3$ and $-2\pi3$, respectively), substituting the $I_{max}$ given by Equation (17) and Equation (8) into Equation (10) makes the upper bound of the third and the fourth range on the right side of Equation (10) equal to the $|I_p^+|$ in Equation (20), respectively. The third and the fourth range in Equation (10) corresponded to phases B and C, respectively. Consequently, if the scaled-down reactive current determined herein are plugged into Equation (10) as $I_Q^\pm$, this equation will provide the maximum $|I_p^+|$ that keeps all of the phase currents below $I_{max}$.

At block 212, the processing unit 102 communicates the revised reactive currents and the revised active currents to the respective IBR 150. The IBR 150 generally has a positive-sequence control loop which receives the references for the revised positive-sequence currents and generates such references. The IBR 150 generally also has a similar loop for generating the revised negative-sequence currents. In the block diagram of FIG. 19, such control loops are part of the "Current Controller" block.

Figure 11A:
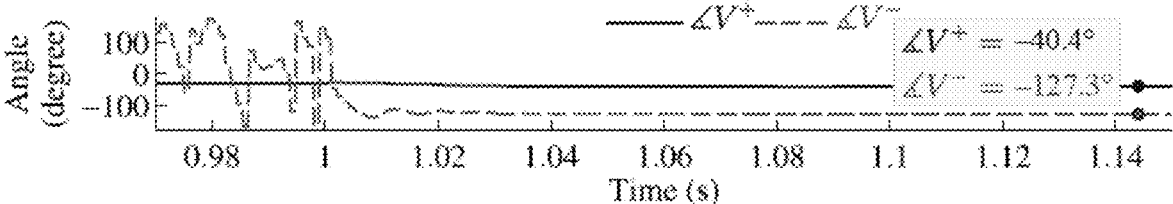
FIGS. 11A to 11C show measurements for IBR-16 in the second example case when the second example case is repeated using the method of FIG. 7, where
Figure 11B:
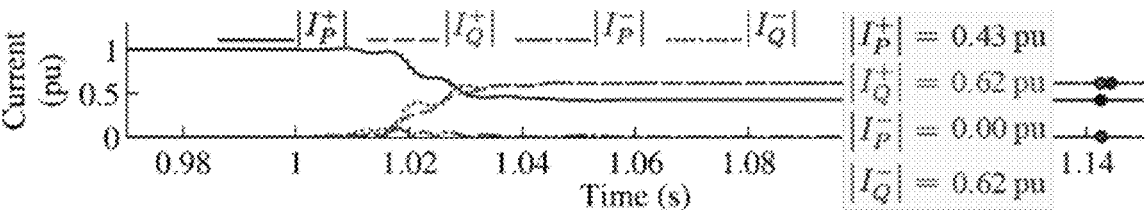
Figure 11C:
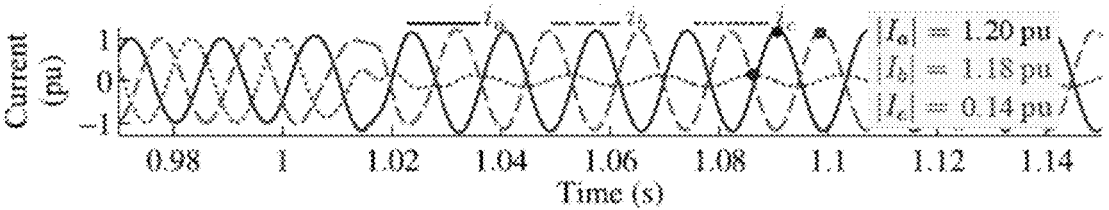

The method 200 can be applicable to a variety of LVRT conditions. In an example, for example Case 2, $|I_{Q-pre}^+|=0.038$ pu (capacitive), $\Delta I_Q^-=0.68$, and $\Delta I_Q^-=0.68$. The angles of the sequence voltages in FIG. 11A give $\beta=93.1°$. For the filter's capacitor, $|I_{Q-cap}^-|=0.035$ pu and $|I_{Q-cap}^-|=0.005$ pu. Substituting these values into Equation (4) and then Equation (10) makes the term under the radical in the third range on the right side of Equation (10) (corresponding to phase B) negative. Thus, $|I_p^+|$ cannot be found in the first step, and the reactive currents must be scaled down. FIGS. 11A to 11C show measurements for IBR-16 in Case 2, where FIG. 11A shows angles of the sequence voltages, FIG. 11B shows active and reactive sequence current magnitudes, and FIG. 11C shows instantaneous currents.

Substituting the above values into Equation (5), the coefficients ($\lambda_{2,\varphi}$, $\lambda_{1,\varphi}$, $\lambda_{0,\varphi}$) of the quadratic equation, Equation (14), for phases A, B, and C (corresponding to $\varphi=0$, $-2\pi3$, and $+2\pi3$) will be (0.8748, 0.0103, 0.0000), (1.7495, 0.0206, 0.0000), and (0.1501, 0.0018, 0.0000), respectively. Solving the three quadratic equations in (13), the solutions for $\rho$ will be $(-1.2889, 1.2771)$, $(-0.9131, 0.9014)$, and $(-3.1035, 3.0917)$, for $\varphi=0$, $-273$, and $+2\pi3$ associated with phases A, B, and C, respectively. Among these values, $\rho=0.9014$ is a solution of Equation (14) for phase B inside the [0,1] range. For this $\rho$, the scaled-down current references on the right side of Equation (10) are $|I_Q^+|=|-|I_{Q-pre}^+|+\rho\Delta I_Q^+|-|I_{Q-cap}^+|=0.62$ pu, and $|I_Q^-|=\rho\Delta I_Q^-+|I_{Q-cap}^-|=0.62$ pu. When these reference currents are plugged into Equation (12), the current of phase B is limited to $I_{max}=1.2$ pu while the current of the other two phases are smaller than the limit ($|I_a|=0.85$ pu and $|I_e|=0.35$ pu). Thus, $\rho=0.9014$ is the acceptable scaling factor.

Since the current of phase B is maximum, the BR will be able to generate $I_p^+$ if $180°<\beta-120°<360°$. $\beta=93.1°$, and so this condition holds. Using the above $I_Q^\pm$, the largest $|I_p^+|$ that satisfies Equation (10) is 0.43 pu, displayed along with $|I_Q^\pm|$ in FIG. 11B. As shown in FIG. 11C, this additional active current keeps the phase currents below $I_{max}$; it just changes the maximum current from phase B to phase A ($|I_a|=1.2$ pu in FIG. 11C). From the perspective of LVRT performance of the IBR, the impact of this $I_p^+$ is profound: it leads to the generation of 74.7 MW of active power by IBR-4, while other common inverter control schemes offer zero active power for this fault scenario.

The advantages of the present embodiments both increase active current generation and maximizes reactive current of the inverter beyond levels provided by other approaches. As described herein, when the $\Delta I_Q^+$ and $\Delta I_Q^-$ given by FIG. 1 make the phase currents exceed $I_{max}$, the scaling factor for $\Delta I_Q^+$ and $\Delta I_Q^-$ can be obtained by dividing $I_{max}$ over the estimated maximum phase current caused by the $\Delta I_Q^+$ and $\Delta I_Q^-$ of FIG. 1. In other approaches, this estimate is obtained based on Equation (1) and is the scalar sum of $|I^+|$ and $|I^-|$. However, the phase current is actually the sum of $I^+$ and $I^-$ (for each phase). The phase angle between $I^+$ and $I^-$ makes the scalar sum used in these approaches larger than $I^++I^-$, causing a smaller scaling factor. This, in turn, makes the reactive current generated by such approaches smaller. In the present method 200, the system 100 estimates the maximum phase current through the vector sum of sequence currents and determines a scaling factor using Equations 12 to 15. This can result in noticeably larger reactive currents. Example Case 3 illustrates this issue.

Case 3

Figure 2:
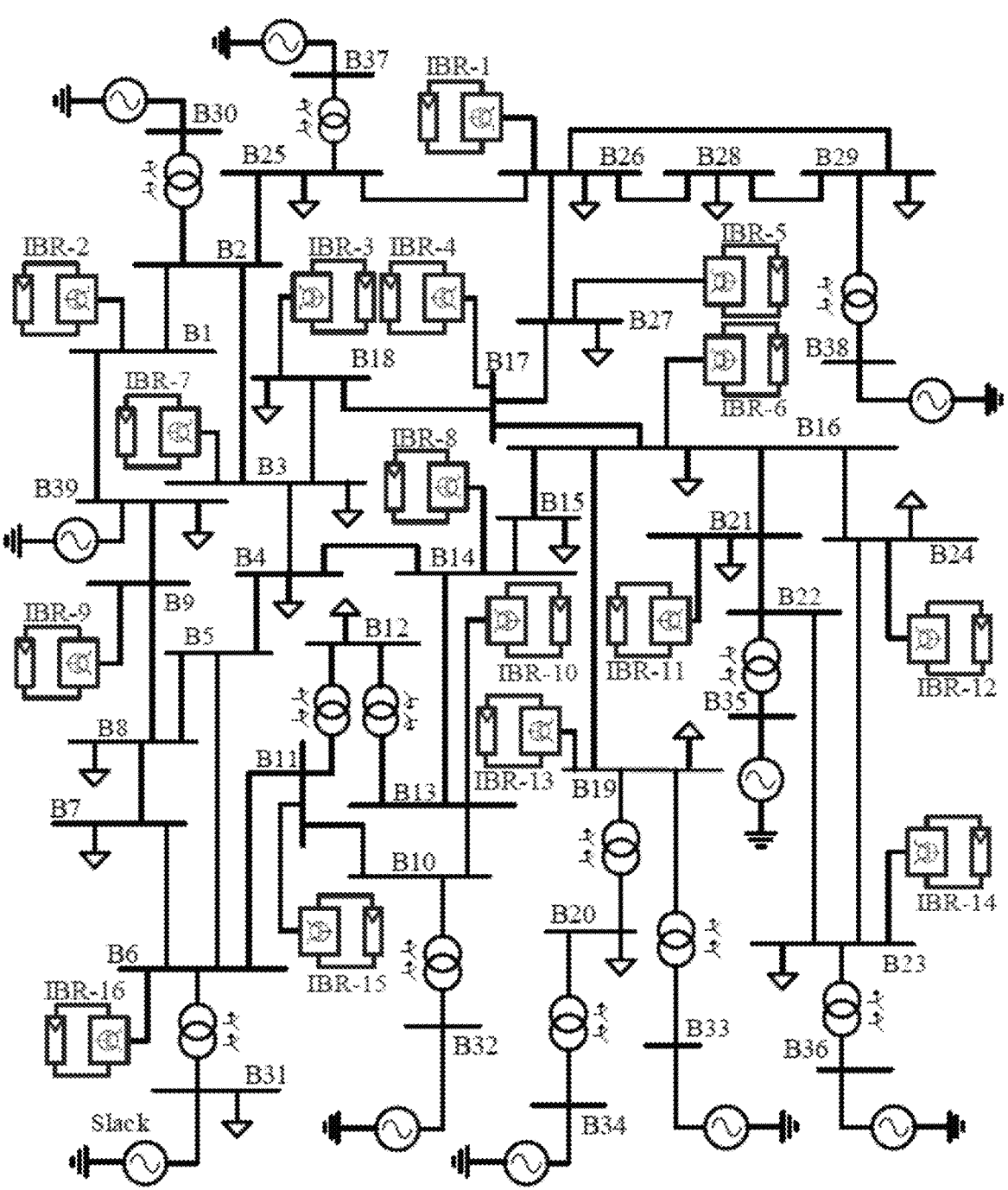
FIG. 2 shows single-line diagram of a test system comprising a number of buses (enumerated B1 to B39) and a number of inverter-based resources (IBR) (enumerated IBR-1 to IBR-16), in accordance with example experiments.

In example Case 3, consider if IBR-4 of FIG. 2 implements other approaches during a bolted AG fault at B16. For this case, $K=6$, $|I_{Q-pre}^+|=0.038$ pu, $\Delta V^+=-0.199$ pu, and $\Delta V^-=0.155$ pu, and so the sequence reactive current references are $|I_Q^+|=1.23$ pu and $|I_Q^-|=0.93$ pu. The maximum phase current estimated by Equation (1) will be 2.16 pu, which violates the 1.2 pu limit. Thus, the reference currents are scaled down by a factor of $I_{max}/2.16=0.555$ to obtain $|I_Q^+|=0.68$ pu and $|I_Q^-|=0.52$ pu shown in FIG. 12A. The maximum of the resultant phase currents in FIG. 12B is $|I_a|=1.05$ pu.

Figure 12A:
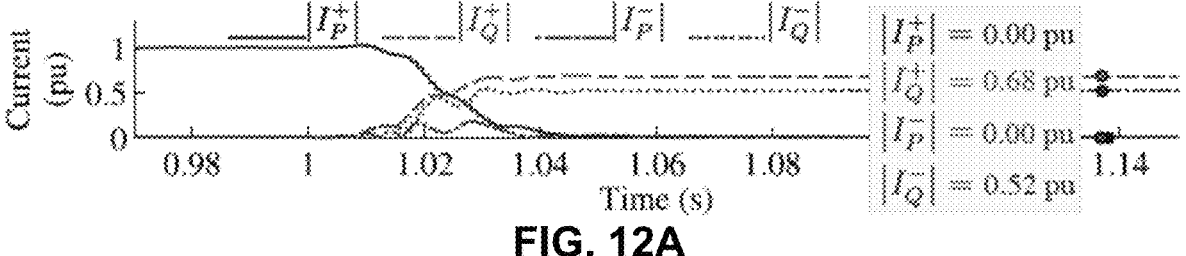
FIGS. 12A to 12C illustrate example measurements for IBR-4 in a third example case using other approaches, where
Figure 12B:
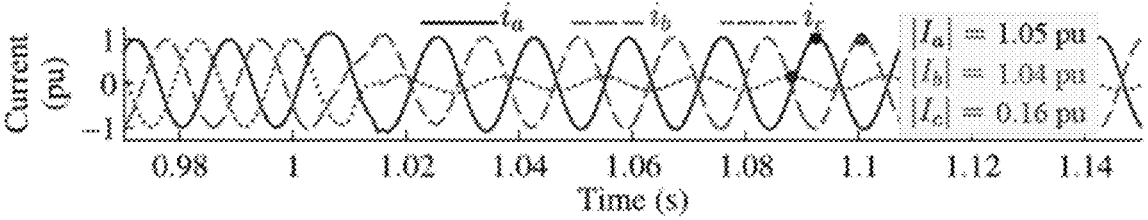
Figure 12C:
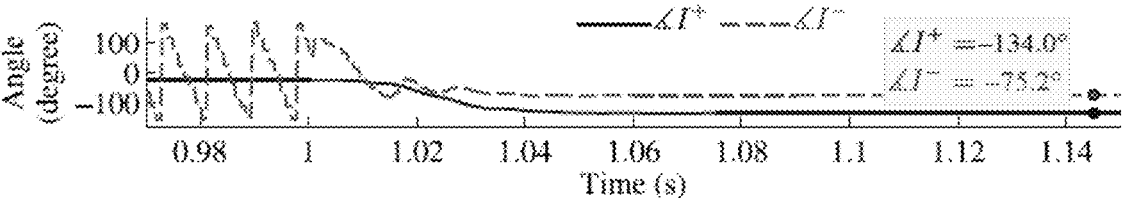
Figure 13A:
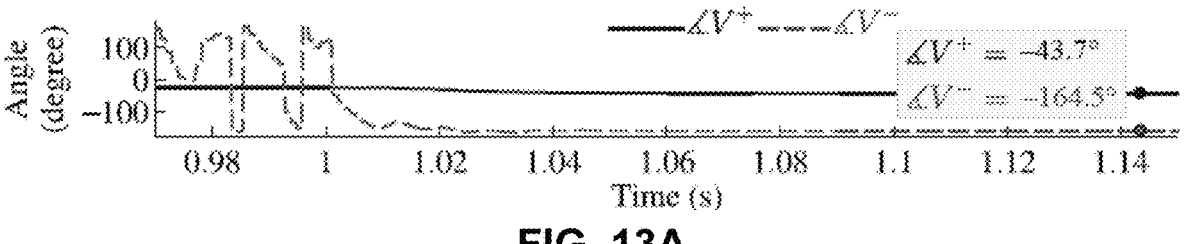
FIGS. 13A to 13C illustrate example measurements for IBR-4 in the third example case using the method of a present embodiment, where
Figure 13B:
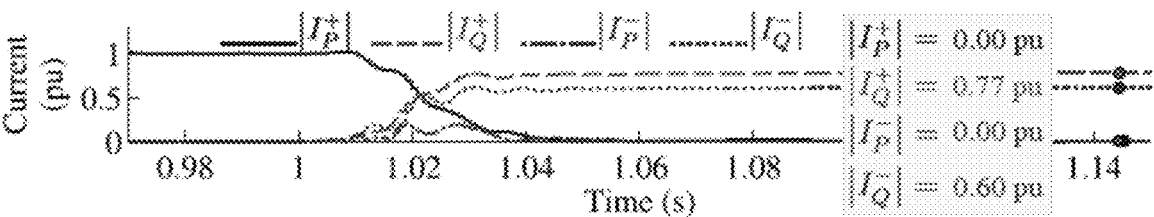
Figure 13C:
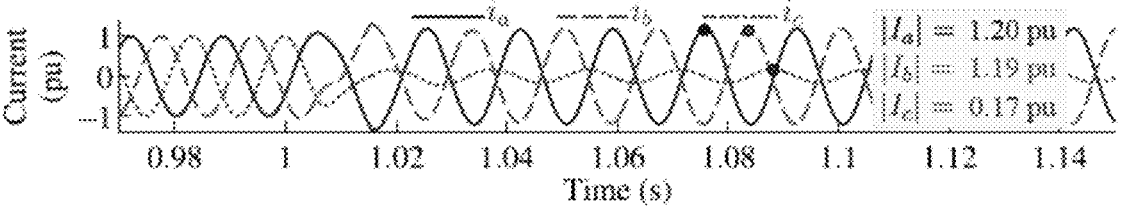

FIGS. 12A to 12C illustrate example measurements for IBR-4 in Case 3 using other approaches, where FIG. 12A shows active and reactive sequence current magnitudes, FIG. 12B shows instantaneous currents, and FIG. 12C shows angles of the sequence currents. FIGS. 13A to 13C illustrate example measurements for IBR-4 in Case 3 using method 200, where FIG. 13A shows angles of the sequence voltages, FIG. 13B shows active and reactive sequence current magnitudes, and FIG. 13C shows instantaneous currents.

If IBR-4 uses method 200, i.e., by substituting $|I_Q^+|=1.23$ pu, $|I_Q^-|=0.93$ pu, $|I_{Q-cap}^+|=0.033$ pu, and $|I_{Q-cap}^-|=0.004$ pu, along with sequence voltage angles of FIG. 13A in Equation (4) and Equation (10), the terms under the radicals in the first and third ranges on the right side of Equation (10) (corresponding to phases A and C) become negative. Thus, $|I_p^+|$ generally cannot be determined and the reactive currents must be scaled down. Determining the coefficients ($\lambda_{2,\varphi}$, $\lambda_{1,\varphi}$, $\lambda_{0,\varphi}$) from Equation (5) and solving Equation (14), the solutions for $\rho$ will be $-0.6524$ and $0.6439$ for phase A, $-0.6576$ and $0.6491$ for phase B, and $-4.5768$ and $4.5691$ for phase C. Two of these solutions, i.e., 0.6439 and 0.6491 are inside the [0,1] range. However, $\rho=0.6491$ yields $|I_a|=1.21$ pu, $|I_b|=1.20$ pu, and $|I_c|=0.17$ pu and so makes the phase A current exceed the limit. The acceptable solution is, therefore, $\rho=0.6439$, for which the sequence currents are $|I_Q^+|=|-|I_{Q-pre}^+|+\rho\Delta I_Q^+|-|I_{Q-cap}^+|=0.77$ pu, and $|I_Q^-|=\rho\Delta I_Q^-+|I_{Q-cap}^-|=0.60$ pu. Note that $\beta=59.2°$ for this case, and the condition for generating extra $|I_p^+|$ described herein does not hold. This would result in the sequence currents of FIG. 13B, which yield the phase currents of FIG. 13C. A comparison between FIGS. 12A and 13B reveals the advantage of method 200, which results in the generation of an additional 16 MVAr reactive power.

Since the GCs generally prioritize reactive current over active current during LVRT, to satisfy the GCs' LVRT requirement other approaches generally, first, check if the reactive currents given by FIG. 1 increase the phase currents beyond the $I_{max}$ limit. Only if this limit is not violated, a non-zero active current is calculated/generated. Otherwise, no attempt is made to generate an active current, as the IBR has supposedly no extra capacity left, and even the pair of reactive currents given by FIG. 1 needs to be scaled down.

Conversely to other approaches, the system 100 first attempts to find the maximum active current for the reactive currents of FIG. 1 without examining whether these reactive currents cause unacceptably large phase currents. Only after this determination are the reactive currents scaled down if need be. This might seem counterintuitive given the requirement to prioritize reactive currents. However, the present inventors determined that for the purpose of prioritizing/maximizing reactive currents, it is necessary to examine the possibility of generating active current before a potential scale-down of reactive currents. This stems from the fact that, depending on the magnitudes/angles of the sequence currents, there may occur a condition in which the non-scaled $I_Q^{\pm}$ of FIG. 1 (without any $I_p^+$) make the phase currents exceed $I_{max}$, while the addition of a properly chosen $I_p^+$ can bring the phase currents below $I_{max}$ without the need to scale down the reactive currents given by FIG. 1. Such a scenario is depicted for the phase A current in FIG. 14. The phase current derived from the sum of $I_Q^-$ and $I_Q^+$, $I_a^{(1)}$, exceeds the $I_{max}$ limit. However, FIG. 14 shows that the addition of $I_p^+$ places the phase current ($I_a^{(2)}$) within the acceptable range without reducing the reactive currents.

Figure 14:
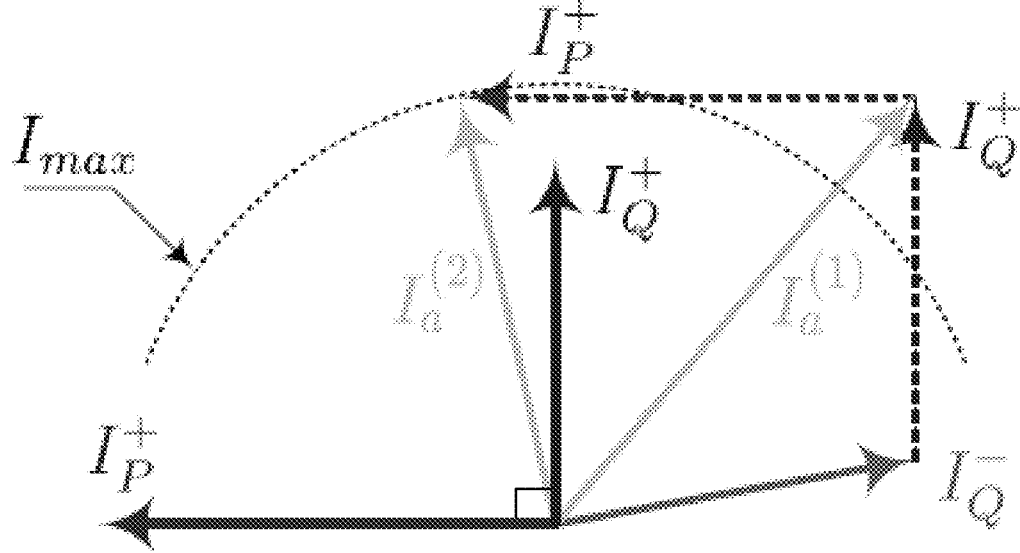
FIG. 14 illustrates a vector diagram illustrating an example of phase currents.

Generally, GCs allow scaling down $I_Q^{\pm}$ only if it is necessary to do so, which is not the case for conditions like the one displayed in FIG. 14. In this way, determining the inverter currents impacts the GC compliance, as illustrated in example Case 4.

Case 4

Figure 15A:
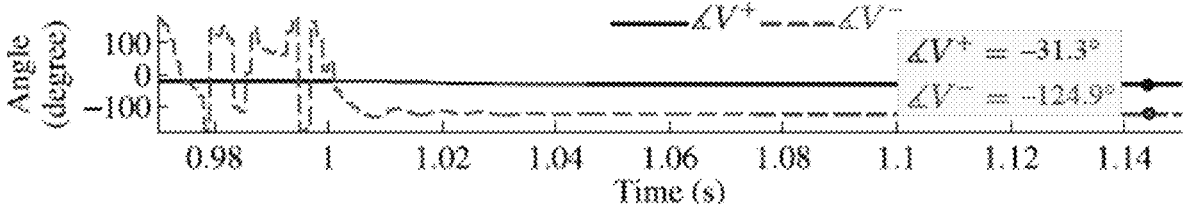
FIGS. 15A to 15C illustrate measurements for IBR-14 in a fourth example case without active current generation, where
Figure 15B:
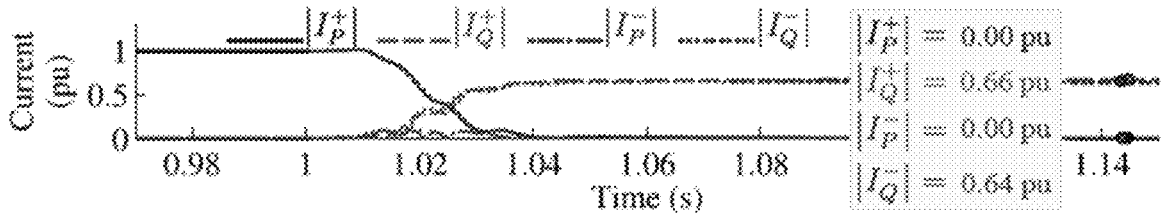
Figure 15C:
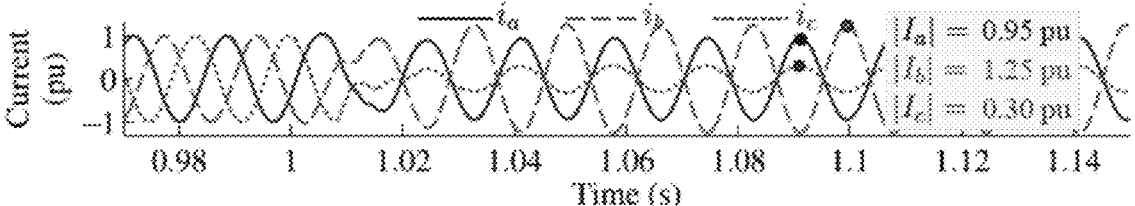

In example Case 4, consider an AG fault with $R_f=5\Omega$ at 40% of the line connecting B23 to B24 in FIG. 2. For IBR-14, $\Delta V^+=-0.109$ pu and $\Delta V^-=0.106$ pu, and so the superimposed reactive currents in FIG. 1 will be $\Delta I_Q^+=-0.65$ pu and $\Delta I_Q^-=-0.64$ pu for K=6. Before the fault, the power factor of this BR is 1 at the POM, which makes the pre-fault reactive current at the POC $|I_{Q\text{-}pre}^+|=0.038$ pu. The POC voltage can be used to calculate $|I_{Q\text{-}cap}^+|=0.037$ pu and $|I_{Q\text{-}cap}^-|=0.003$ pu for the shunt capacitor of the inverter's filter. Therefore, the reactive current references given by Equation (4) are $|I_Q^+|=0.66$ pu and $|I_Q^-|=0.64$ pu. Using the sequence voltage angles shown in FIG. 15A, the angles of $I_Q^+$ and $I_Q^-$ are $-121.3°$ and $-34.9°$, respectively. If the IBR generates these reactive currents, with no active current, as in FIG. 15B, the current of phase B will exceed the limit in FIG. 15C. If the sequence of steps used by the proposed method is not applied, the only way to bring the phase current within the acceptable range is to scale down $I_Q^{\pm}$ by 96%; i.e., sub-optimal reactive currents and zero active current. FIGS. 15A to 15C illustrate measurements for IBR-14 in example Case 4 without active current generation, where FIG. 15A shows active and reactive sequence current magnitudes, FIG. 15B shows instantaneous currents, and FIG. 15C shows angles of the sequence voltages.

Figure 16A:
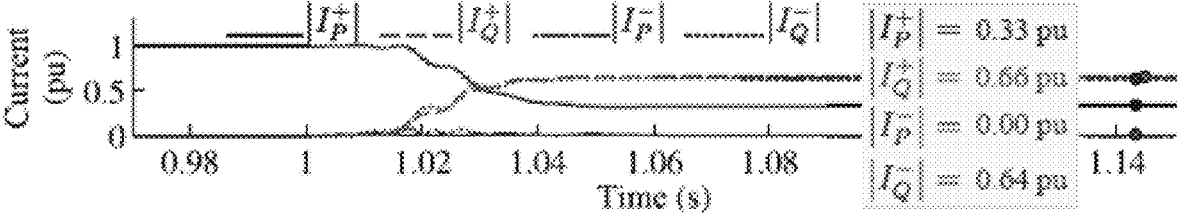
FIGS. 16A and 16B illustrate measurements for IBR-14 in the fourth example case with the method of a present embodiment, where
Figure 16B:
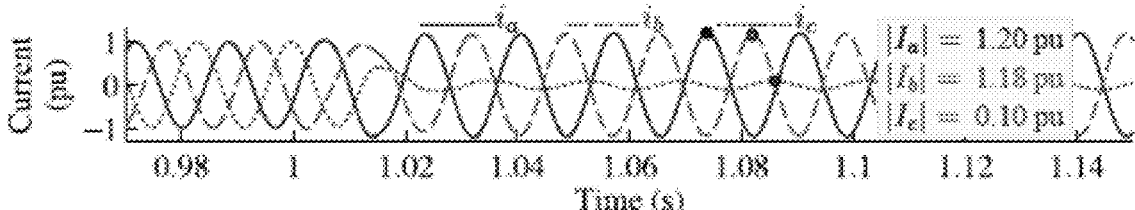

Meanwhile, if the reactive currents and sequence voltage angles shown in FIG. 15B and FIG. 15C are plugged into Equation (10), the $|I_p^+|$ generated by the inverter can be as large as 0.33 pu. Using the sequence voltage angles of FIG. 15C, the angle of $I_p^+$ is $-31.3°$. The relative angle of this $I_p^+$ and the above-mentioned reactive currents brings $|I_b|$ below $I_{max}$ and makes $|I_a|$ equal to $I_{max}$ (as illustrated in FIGS. 16A and 16B). Therefore, the phase current limit is satisfied without reducing reactive currents and with generating maximum active current; i.e., full compliance with GCs. The active power generated by the IBR is relatively substantial and exceeds 60 MW. FIGS. 16A and 16B illustrate measurements for IBR-14 in example Case 4 with the method 200, where FIG. 16A shows active and reactive sequence current magnitudes and FIG. 16B shows instantaneous currents.

As described herein, IBR can generate non-zero $|I_p^+|$ after $I_Q^{\pm}$ are scaled down only if $\beta+\varphi$ is inside the $[180°, 360°]$ range, where $\varphi$ is 0, $+120°$, or $-120°$ when the maximum phase current after scaling down $I_Q^{\pm}$ occurs in phase A, phase B, or phase C, respectively. The present inventors investigated the likelihood of $180°<(\beta+\varphi)<360°$ in real power systems; which was determined to depend on the fault type.

For a bolted AG fault, the phase lead of the negative-sequence voltage over the positive-sequence voltage ($\theta_{V^-}-\theta_{V^+}$) is about 180°. This angle progresses in the counterclockwise direction as the fault resistance increases, but the progression does not exceed 60°~70° even for very large fault resistances. Thus, $\theta_{V^-}-\theta_{V^+}$ is inside the $[180°, 240°\ ]$ range at an IBR's POM. Assuming a YNd1 interface transformer for the IBR, $\theta_{V^-}$ and $\theta_{V^+}$ shift by $+30°$ and $-30°$ when moving from the POM to the POC, and so the $\beta$ (defined in Equation (8)) measured at the POC is normally inside $[60°, 120°\ ]$ for AG faults and YNd1 transformer.

Additionally, the phase lead of the negative-sequence reactive current over the positive-sequence reactive current, $\angle I_Q^- - \angle I_Q^+$, obtained through Equation (12), is $\beta$, $\beta-120°$, and $\beta+120°$, for phases A, B, and C, respectively. Given the above range for $\beta$, the following angles are obtained at the POC:

$$60° < \angle I_Q^- - \angle I_Q^+ < 120° \text{ for phase } A,$$

$$-60° < \angle I_Q^- - \angle I_Q^+ < 0° \text{ for phase } B, \text{ and}$$

$$180° < \angle I_Q^- - \angle I_Q^+ < 240° \text{ for phase } C.$$

The smaller angle between the two sequence components of phase B current makes $I_b$ larger than the phase A and C currents and equal to $I_{max}$. As described herein, when $I_b=I_{max}$, the IBR is able to generate $|I_p^+|$ if $180°<\beta-120°<360°$. This condition is normally satisfied as the above described how $\beta$ is inside $[60°, 120°\ ]$ for AG faults.

For a YNd11 transformer, $\theta_{V^-}$ and $\theta_{V^+}$ shift by $-30°$ and $+30°$, respectively, when moving from the POM to the POC, and so normally $-60°<\beta<0°$ at the POC during AG faults. This would make the angle between $I_Q^+$ and $I_Q^-$ minimum for phase A, hence $I_a=I_{max}$. Thus, the IBR is able to generate $|I_p^+|$ if $180°<\beta<360°$. This condition normally holds since $-60°<\beta<0°$ as described herein. A similar analysis and conclusion can be made for phase-B- and phase-C-to-ground faults as well.

For BC and BCG faults, $\theta_{V^-}-\theta_{V^+}$ at the POM is close to zero. As the fault location moves farther from the IBR, the presence of intermediate infeed currents with active component in the path between the BR and the fault location makes this angle retard into the fourth quadrant. The active intermediate infeed currents are generated by the other IBRs and synchronous generator-based sources (the latter of which has a greater impact due to its higher fault current magnitude). As a result, $\theta_{V^-}-\theta_{V^+}$ tilts towards the $[-60°, 0°]$ range at the POM. Considering the $\pm30°$ phase shifts introduced by a YNd1 transformer, $\beta$ given by Equation (8) is in the $[180°, 240°]$ range at the POC. Using Equation (12), this range for $\beta$ leads to:

$$180° < \angle I_Q^- - \angle I_Q^+ < 240° \text{ for phase } A,$$

$$60° < \angle I_Q^- - \angle I_Q^+ < 120° \text{ for phase } B, \text{ and}$$

$$-60° < \angle I_Q^- - \angle I_Q^+ < 0° \text{ for phase } C.$$

The angle between the negative- and positive-sequence reactive currents is smaller for phase C, indicating that the current of phase C is maximum and equal to $I_{max}$. As described herein, when the phase C current is maximum, an IBR can generate $I_p^+$ if $180° < \beta + 120° < 360°$. Meanwhile, it was shown in the above that $180° < \beta < 240°$, and so $300° < \beta < 360°$. Thus, the condition on $\beta$ to generate $I_p^+$ holds.

If the transformer's vector group is YNd11, $\beta$ at the POC is normally inside [60°, 120° ] for BC and BCG faults. This makes $I_b$ equal to $I_{max}$. Thus, the IBR is able to generate $|I_p^+|$ if $180° < \beta - 120° < 360°$, which is usually satisfied since $\beta$ is inside [60°, 120° ] as mentioned above. A similar result is obtained for other double-phase faults as well Advantageously, the method 200 can factor in the current of the LC filter's shunt capacitor ($I_{Q\text{-}cap}$) in the formulation that derives the reference current. This would marginally impact the reference currents derived herein. $I_{Q\text{-}cap}$ is an uncontrolled current that is added to the currents of the inverter switches before the POC. Thus, if $I_{Q\text{-}cap}$ is neglected when the reference currents are determined, the superimposed reactive currents measured at the POC will deviate slightly from what the GC may require. This error can be compensated for the positive-sequence circuit in Equation (4) by subtracting $|I_{Q\text{-}cap}^+|$ from the required reactive current at the POC, i.e., $|\pm|I_{Q\text{-}pre}^+ + \Delta I_Q^+|$. Similarly, $\Delta I_{Q\text{-}cap}^-$ can be reactive current. Therefore, besides the absolute precision in complying with the GC, considering $I_{Q\text{-}cap}^\pm$ determined in the method 200 creates more room to generate active current.

In addition to maintaining the balance between the load and generation, maximum utilization of the IBRs' current generation capacity by the method 200 enhances the grid stability from the following perspectives:

The GCs mandate that after the LVRT, the IBRs ramp up the active power to the pre-LVRT level quickly to prevent instability. However, high ramp rates for the active power can cause voltage fluctuations if the grid is not strong; a common scenario with the increased penetration of IBRs. Maximizing the IBRs' active power during the LVRT enables the BR to return to the pre-LVRT level of active power without the need for a high ramp rate.

Maximizing the IBRs' reactive current described herein improves the grid's short-term voltage stability and fault-induced delayed voltage recovery.

Provided herein is an example comparative analysis to show the system-wide impact made by the method 200 in increasing the power of the IBRs across the grid shown in FIG. 2. Table 1 shows the total active and reactive power (P and Q) generated by the IBRs in FIG. 2 using three techniques for different fault locations, fault types, and IBR K-factors. Columns 5 to 7 report the results for the other techniques. Table 1 also reports the results for two versions of the method 200: the version reported in columns 11 to 13 strictly follows the relations described herein; the other version in columns 8 to 10 removes $I_{Q\text{-}cap}^\pm$ from Equation (4) to neglect the capacitor's effect, enabling direct comparison with the other techniques.

TABLE 1

| Case No. | Fault location | Fault type | K-factor | Other Techniques | | | Method 200 (without current compensation) | | | Method 200 (with current compensation) | | |
|---|---|---|---|---|---|---|---|---|---|---|---|---|
| | | | | $P^+$ (MW) | $Q^+$ (MVAr) | $Q^-$ (MVAr) | $P^+$ (MW) | $Q^+$ (MVAr) | $Q^-$ (MVAr) | $P^+$ (MW) | $Q^+$ (MVAr) | $Q^-$ (MVAr) |
| 1 | B3 | AG | 2 | 2437 | 870 | 99 | 2471 | 884 | 103 | 2476 | 800 | 103 |
| 2 | B3 | AG | 4 | 1712 | 1389 | 112 | 1781 | 1445 | 118 | 1813 | 1372 | 118 |
| 3 | B3 | AG | 6 | 833 | 1762 | 105 | 1051 | 1920 | 112 | 1093 | 1862 | 112 |
| 4 | B3 | BC | 2 | 2121 | 885 | 169 | 2219 | 882 | 169 | 2222 | 810 | 170 |
| 5 | B3 | BC | 4 | 1096 | 1452 | 200 | 1472 | 1456 | 201 | 1492 | 1398 | 202 |
| 6 | B3 | BC | 6 | 357 | 1697 | 196 | 800 | 1734 | 199 | 823 | 1693 | 200 |
| 7 | B3 | BCG | 2 | 2076 | 1097 | 64 | 2098 | 1096 | 64 | 2117 | 1028 | 64 |
| 8 | B3 | BCG | 4 | 1177 | 1862 | 80 | 1424 | 1860 | 81 | 1467 | 1805 | 81 |
| 9 | B3 | BCG | 6 | 388 | 2155 | 81 | 706 | 2179 | 81 | 738 | 2146 | 82 |
| 10 | B16 | AG | 2 | 1836 | 1065 | 190 | 1880 | 1092 | 198 | 1895 | 1017 | 199 |
| 11 | B16 | AG | 4 | 816 | 1522 | 209 | 908 | 1684 | 226 | 934 | 1628 | 227 |
| 12 | B16 | AG | 6 | 475 | 1685 | 206 | 535 | 1944 | 222 | 556 | 1902 | 224 |
| 13 | B16 | BC | 2 | 1500 | 1005 | 296 | 1663 | 1005 | 297 | 1669 | 944 | 300 |
| 14 | B16 | BC | 4 | 586 | 1395 | 326 | 892 | 1414 | 327 | 907 | 1370 | 331 |
| 15 | B16 | BC | 6 | 288 | 1503 | 325 | 606 | 1535 | 325 | 609 | 1500 | 329 |
| 16 | B16 | BCG | 2 | 1483 | 1227 | 95 | 1527 | 1226 | 95 | 1547 | 1174 | 97 |
| 17 | B16 | BCG | 4 | 604 | 1754 | 110 | 767 | 1763 | 110 | 789 | 1728 | 112 |
| 18 | B16 | BCG | 6 | 300 | 1889 | 111 | 484 | 1902 | 111 | 492 | 1877 | 113 | added to the required negative-sequence reactive current at the POC (i.e., $\Delta I_Q^-$) in Equation (5) to derive $|I_Q^-|$. Thus, when $I_{Q\text{-}cap}^\pm$ is taken into account, the BR generates smaller positive- and larger negative-sequence reactive currents, compared to when $I_{Q\text{-}cap}^\pm$ is neglected.

Since the positive-sequence voltage at the POC never drops below the negative-sequence voltage, $|I_{Q\text{-}cap}^+|$ always exceeds $|I_{Q\text{-}cap}^-|$. Therefore, when $I_{Q\text{-}cap}^\pm$ is taken into account, the decrease in the positive-sequence reactive current is larger than the increase in the negative-sequence Columns 5 and 8 of Table 1 indicate the for all fault conditions $P^+$ of the method 200 is larger. Consider, for example, case 6 with K=6. The total active power generated by the IBRs using the method 200 is 443 MW (124%) larger than the total active power when the other techniques are used. A noticeable pattern for $P^+$ in Table 1 is that as the K-factor increases, the active power generated by the method 200 becomes more superior. For instance, for a BC fault at bus B16, and for K=2, K=4, and K=6, the method 200 generates 163 MW (11%), 306 MW (52%), and 318

MW (110%), respectively, more than the other techniques. The reason is that for larger K-factors, the other techniques do not attempt to generate any active current after scaling down the reactive currents. For the method 200, however, large amounts of active current can be generated.

As discussed herein, one of the advantages of the method 200 lies in the generation of not only larger active power, but also higher levels of reactive power. As shown in Table 1, the improvement in the reactive power is more significant for cases involving single-line-to-ground faults and large K-factors. These are the cases for which the reactive currents need to be scaled down due to the large K-factor even though the voltage drop at the POC is not very severe. In Case 12, for example, the IBRs generate 259 MVAr (15%) of extra reactive if they use the method 200. For the same case, the method 200 generates 64 MW (13%) of additional active power as well. Only in three cases with lower K-factor, the $Q^+$ generated by the method 200 is 1 to 3 MVAr smaller. For instance, the $Q^+$ given by the method 200 is 882 MVAr, while the other techniques yield 885 MVAr; i.e., a mere 0.34% difference. This stems from the fact that for the other techniques, the dip in the positive-sequence voltage during the transients of the first cycle of the fault is larger. The first cycle of the fault is when the K-factor diagram in FIG. 1 is used to calculate $\Delta I_Q^+$. Therefore, a larger reactive current is obtained by the K-factor diagram.

Comparison of columns 7 and 10 in Table 1 reveals that the method 200 generates larger $Q^-$ for all of the cases. Meanwhile, the pattern of variations for $Q^-$ is different from what is observed for $Q^+$. As the K-factor increases, $Q^+$ generated by IBRs naturally increases for all of the three approaches in Table 6. Similarly, $Q^-$ increases in columns 7, 10, and 13 as K is increased from 2 to 4. However, in most cases, from K=4 to K=6, $Q^-$ decreases. The reason is that from K=4 to K=6, the generation of larger amount of $Q^+$ causes the power system to become more balanced, with larger positive-sequence voltage and smaller negative-sequence voltage throughout the grid.

As described herein, compensating for the current of the filter's capacitor enables the IBR to generate larger active currents. Furthermore, a comparison between the reactive currents of the two approaches confirms that when an BR compensates for the current of the shunt capacitor, $Q^+$ decreases and $Q^-$ increases. The numbers for $Q^-$ seem to stay unchanged in some cases. This is likely due to the rounding error. For instance, $Q^-$ in Case 1 for the method 200 without and with compensation of the capacitor's current is 103.00 MVAr and 103.13 MVAr, respectively.

Instead of using closed form mathematical relations, in some cases, scaling down the reactive currents and recalculating the active current can be combined and carried out using an optimization technique. In these cases, an optimization problem can be optimized with the objective function of maximizing ρ and the following constraints:

$$0 < \rho < 1 \tag{21}$$

$$|I_P^+| \geq 0 \tag{22}$$

$$\left[|\pm|I_{Q,pre}^+|+\rho\Delta I_Q^+| - |I_{Q,Cap}^+| + (\rho\Delta I_Q^- + |I_{Q,Cap}^-|)\cos(\beta + \varphi)\right]^2 + \tag{23}$$

$$\left[|I_P^+| + (\rho\Delta I_Q^- + |I_{Q,Cap}^-|)\sin(\beta + \varphi)\right]^2 \leq I_{max}^2$$

Constraints of Equation (21) and Equation (22) are features of ρ and $|I_p^+|$, and Equation (23) implies that the phase currents have to satisfy their limit. Convex optimization problems have a globally optimum answer and can be solved through any suitable standard convex solver.

In addition to the objective function of finding the largest scaling factor ρ, this optimization problem should guarantee that the maximum phase current capacity of the BR is used; i.e., at least one of the phase currents becomes exactly equal to the $I_{max}$ limit. However, one concern might be that ρ and $|I_p^+|$ are found such that the phase currents become less than the limit, while none of them is equal to the limit. The following proves that this scenario is impossible. Based on the geometric interpretation of the optimality condition, it can be concluded that the optimal point of a convex problem exists on the boundary of the feasibility set of the optimization problem. As the optimization problem is convex, the optima exist on the boundary of the feasibility set. This implies that the optimal (ρ, $|I_p^+|$) is in either of the following sets:

$$\mathcal{B}_1 = \{(\rho, |I_P^+|): 0 < \rho < 1, |I_P^+| = 0\} \tag{24}$$

$$\mathcal{B}_2 = \{(\rho, |I_P^+|): 0 < \rho < 1, |I_P^+| > 0, \max\{|I_a|, |I_b|, |I_c|\} = I_{max}\} \tag{25}$$

If at the optima, $|I_p^+|$=0, then the largest value for ρ is what was determined from Equation (14), which would make at least one of the phase currents saturate at the limit. Therefore, if the optima is in $\mathcal{B}_1$, then at least one of the phase currents saturates at the limit. Furthermore, the optima being in $\mathcal{B}_2$ trivially results in at least one of the phase currents being equal to the limit.

Advantageously, the computation time of this optimization approach is not substantial. The optimization problem is quadratic with only two variables, i.e., ρ and $|I_p^+|$. Such small optimization problems can be solved in around one millisecond using available solvers.

Figure 17A:
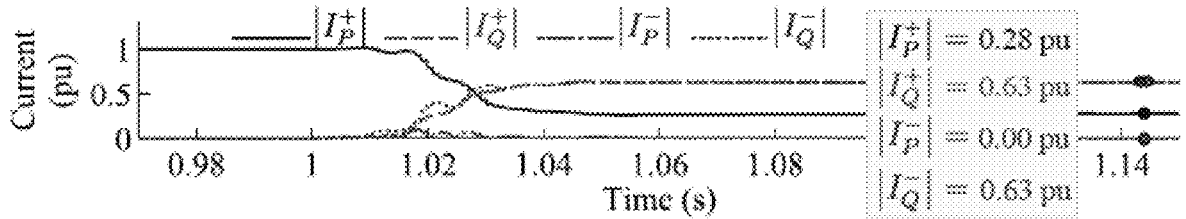
FIGS. 17A and 17B illustrate measurements for IBR-16 in the second example case, generating optimally scaled-down reactive currents with active current, where
Figure 17B:
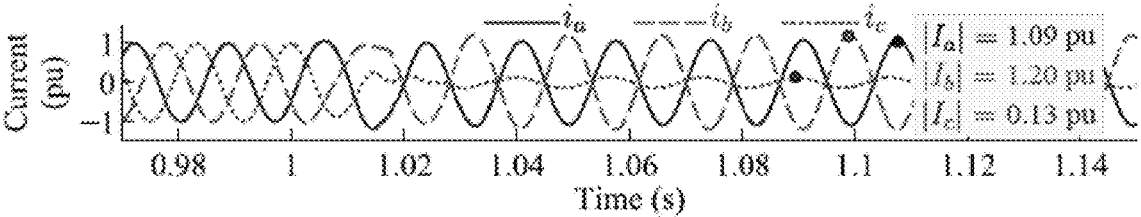

For example, example Case 2, in which the superimposed reactive currents obtained from FIG. 1 needed to be scaled down, was repeated using the optimization approach. The scale factor ρ calculated from solving Equation (14) was 0.9014. The optimization then finds the largest scaled-down reactive currents and active current, simultaneously. The optimal scale factor ρ calculated from solving the optimization problem is 0.9286. The sequence active and reactive currents can then be as presented in FIG. 17A. As observed from FIG. 17B, all phase currents satisfy the limit, and one of them is bound at the IBR's limit. This confirms that at least one of the three phase current constraints in Equation (23) has to be activated.

Figure 18:
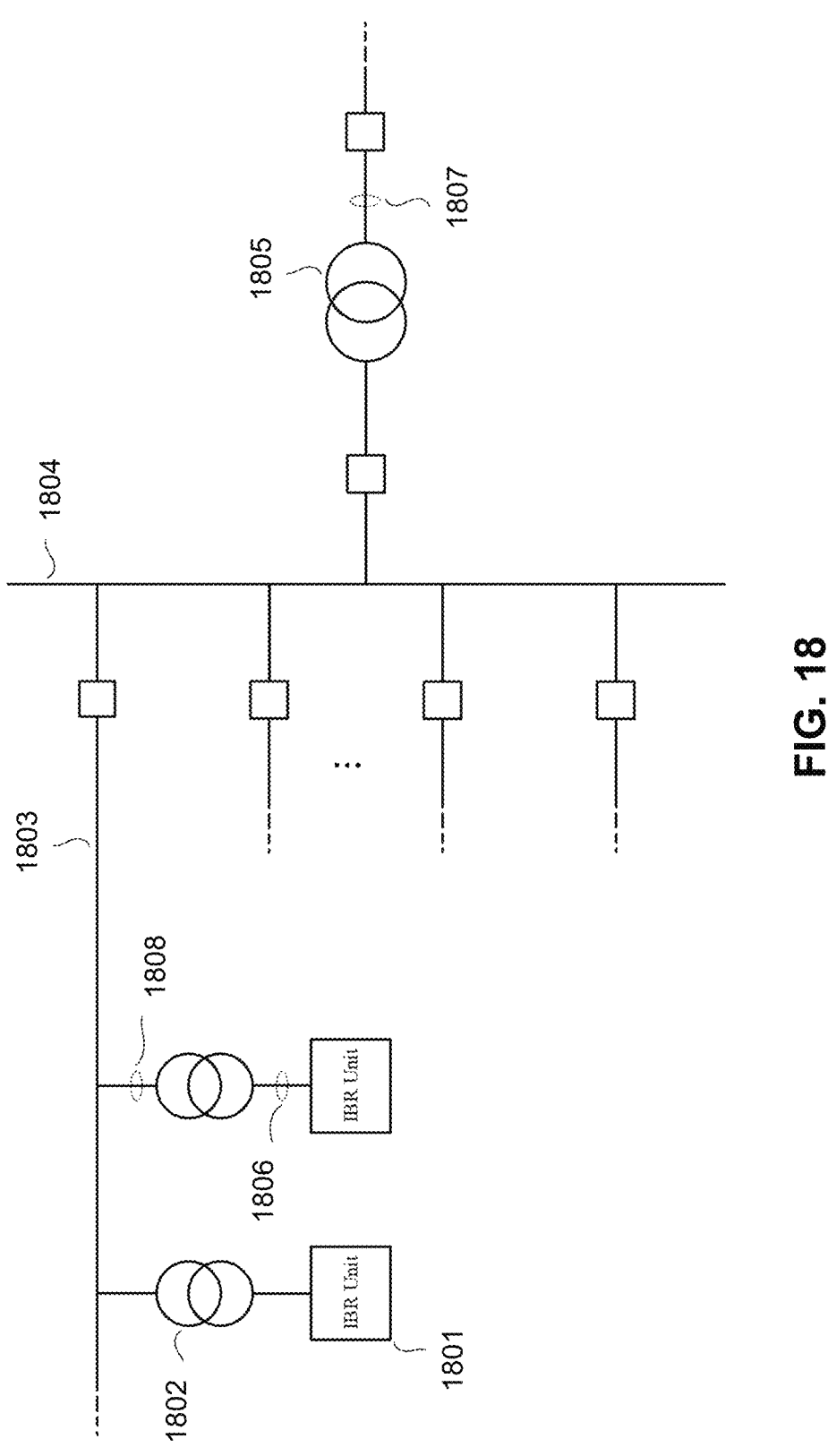
FIGS. 18 to 22 illustrate a block diagram of an example implementation of the system of the present embodiment.

FIGS. 18 to 22 illustrate an example block diagram of an implementation of the system 100. FIG. 18 shows an example of an BR configuration. In FIG. 18, component 1801 includes the inverter, its LC filter, a control system, and a DC-side source(s). In particular cases, the components of FIGS. 19-22 are implemented within component 1800 of FIG. 18. Also shown is an BR unit transformer 1802. Multiple feeders 1803 may connect multiple BR units and their unit transformers to the collector bus 1804. The collector bus 1804 is then interfaced to the rest of the power system by the main BR transformer 1805. Also shown in the point of connection (POC) at location 1806 or 1807, and the point of measurement (POM) 1807, as described herein. Some standards and GCs may choose different locations for the POC and the POM. FIG. 18 follows the more common approach, which is now adopted by the IEEE P2800 standard. Changing the location of the POC and/or the POM may require very minor changes, but does not have a material impact on the present embodiments.

Figure 19:
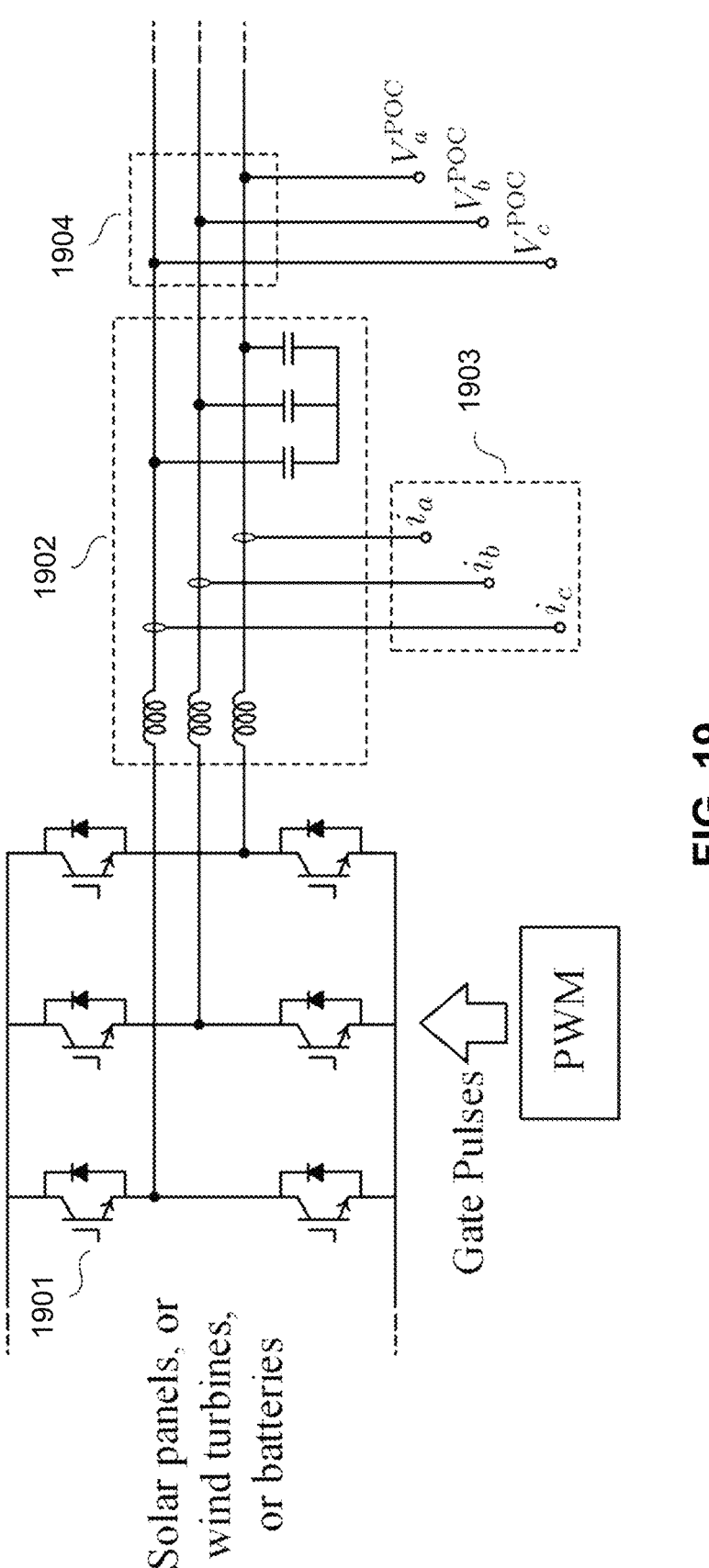

FIG. 19 shows various components of the BR 150. Shown is one of the power electronic switches 1901 of the inverter. When the present disclosure refers to a current limit of the switches, the current limit of these components is being generally referred to. Also shown is the LC filter 1902 of the inverter. The currents 1903 shown are where measurements are taken from before the LC filter's shunt capacitor. Also shown is a point of connection (POC) 1904 of the inverter.

In some cases, it may be possible to neglect the shunt capacitor from the LC filter 1902 of the inverter; and the inverter will still be able to operate, but with some degree of distortion in the currents. Neglecting the LC filter's capacitor's currents may be a safe practice because some GCs allow small deviations from the required reactive currents as illustrated in FIG. 1. If the shunt capacitor's reactive currents are neglected, the system 100 will still operate as described. To neglect the capacitor's currents, $|I_{Q\text{-}cap}{}^+|$ and $|I_{Q\text{-}cap}{}^-|$ can be set accordingly and the associated equations can be amended; for example:

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix} \qquad \text{Amended Equation (2)}$$

$$\begin{bmatrix} |\pm|I_{Q\text{-}pre}^+|+\Delta I_Q^+|\angle\left(\theta_{V^+} - \frac{\pi}{2}\right) + |I_P^+|\angle(\theta_{V^+}) \\ \Delta I_Q^-\angle\left(\theta_{V^-} + \frac{\pi}{2}\right) \end{bmatrix}$$

$$|I_Q^+| = |\pm|I_{Q\text{-}pre}^+|+\Delta I_Q^+| \qquad \text{Amended Equation (4)}$$

$$|I_Q^-| = \Delta I_Q^- \qquad \text{Amended Equation (5)}$$

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix} \begin{bmatrix} (|\pm|I_{Q\text{-}pre}^+|+\rho\Delta I_Q^+|)\angle\left(\theta_{V^+} - \frac{\pi}{2}\right) \\ \rho\Delta I_Q^-\angle\left(\theta_{V^-} + \frac{\pi}{2}\right) \end{bmatrix} \quad \text{Amended Equation (12)}$$

$$I_{max}^2 = (|\pm|I_{Q\text{-}pre}^+|+\rho\Delta I_Q^+|)^2 + (\rho\Delta I_Q^-)^2 + \qquad \text{Amended Equation (13)}$$
$$2(|\pm|I_{Q\text{-}pre}^+|+\rho\Delta I_Q^+|)(\rho\Delta I_Q^-)\cos(\beta+\varphi)$$

$$\lambda_{2\varphi} = (\Delta I_Q^+)^2 + 2\mu\Delta I_Q^+\Delta I_Q^-\cos(\beta+\varphi) + (\Delta I_Q^-)^2 \quad \text{Amended Equation (15)}$$
$$\lambda_{1\varphi} = \pm 2\mu|I_{Q\text{-}pre}^+|\Delta I_Q^+ \mp 2\mu|I_{Q\text{-}pre}^+|\Delta I_Q^-\cos(\beta+\varphi)$$
$$\lambda_{0\varphi} = |I_{Q\text{-}pre}^+|^2$$

$$[|\pm|I_{Q,pre}^+|+\rho\Delta I_Q^+| + \rho\Delta I_Q^-\cos(\beta+\varphi)]^2 + \qquad \text{Amended Equation (23)}$$
$$[|I_P^+| + \rho\Delta I_Q^-\sin(\beta+\varphi)]^2 \le I_{max}^2$$

Figure 20:
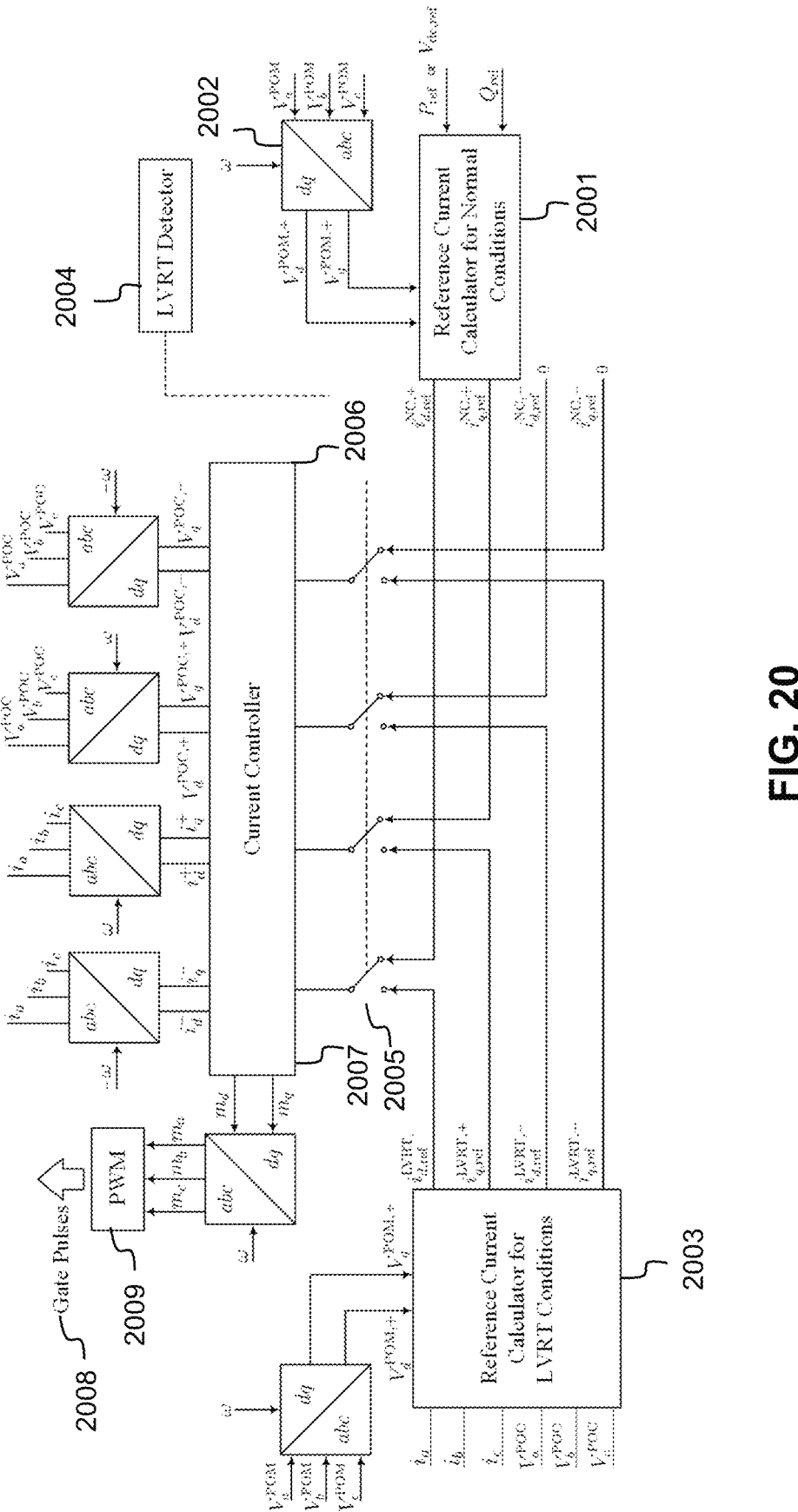

For FIG. 20, Block 2001 calculates the current references during normal condition. Here, as an example, Block 2001 takes "$P_{ref}$ or $V_{dc,\,ref}$" and "$Q_{ref}$" as inputs. Different strategies for the inverter's control during the normal conditions (e.g., whether $P_{ref}$ or $V_{dc,\,ref}$ is being regulated) generally do not affect operation of the system 100. Block 2002 performs the transformation from natural reference frame (abc) to synchronous reference frame (dq). Block 2003 generates the reference currents for the LVRT condition, as described herein; generally including the diagrams of FIGS. 21 and 22. Block 2004 detects the LVRT condition. When the LVRT is detected, at Block 2005, switches switch from the references for normal condition determined under Block 2001 to the references calculated under Block 2003 for the LVRT condition. Block 2006 tracks the current references using appropriate controllers. The outputs of Block 2006 are modulation signals shown at Block 2007 (i.e., md and mq). These signals are then used to generate the switching commands at Block 2008, by a PWM technique at Block 2009.

Figure 21:
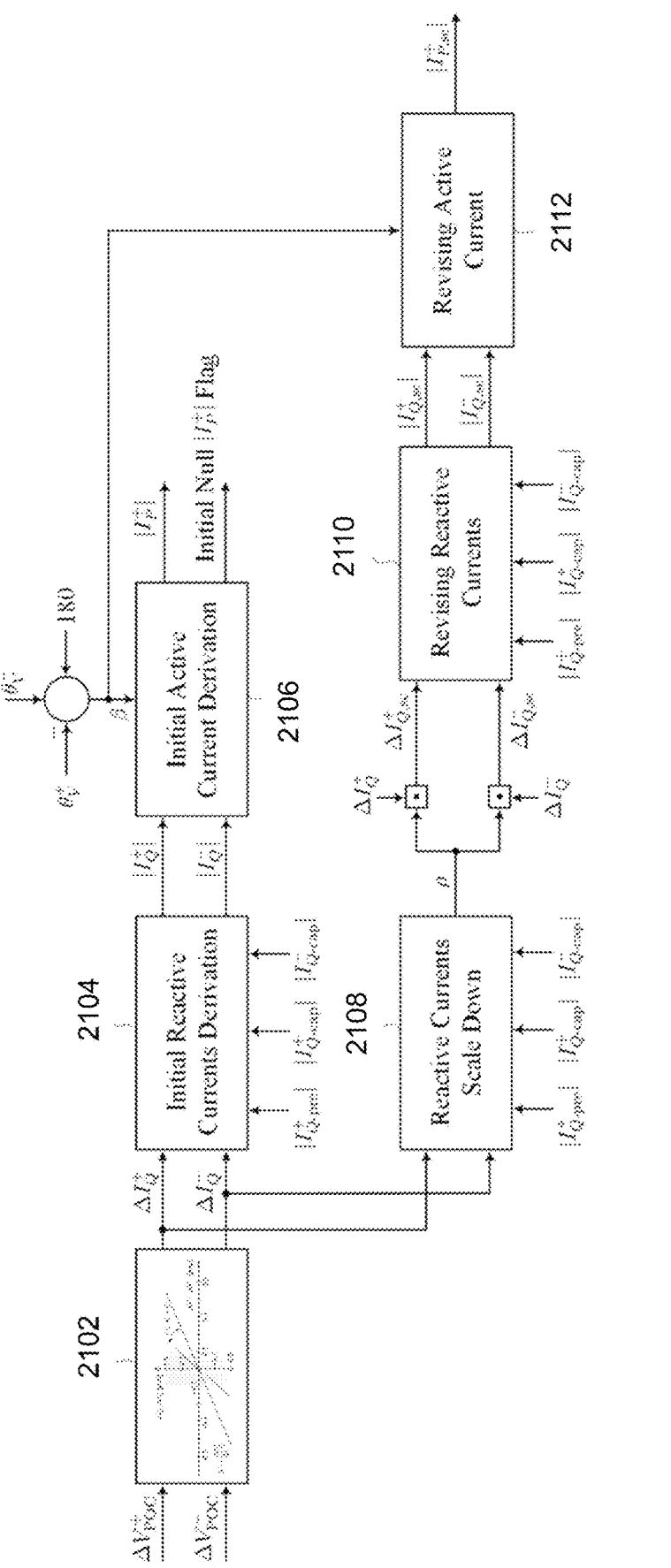

For FIG. 21, Block 2102 represents determining of the sequence reactive currents based on the sequence voltage changes. This can be performed using the K-factor diagram in FIG. 1 or any other grid code/standard for grid integration of inverter-based resources. Block 2104 represents performance of Equation (4) and Equation (5) to calculate the initial references for the sequence reactive currents. Block 2106 represents using the upper bound of the intersection of the four ranges given by Equation (10) to determine the maximum positive-sequence active current. Block 2108 represents determining of the scaling factor ρ. Equation (14) is solved for each phase; then, the largest ρ within the [0,1] range that is the solution of Equation (14) for one of the phases but also keeps the current magnitude in the other two phases below $I_{max}$ is the output of this block. Block 2110 represents determination of the revised references for sequence reactive currents from the right side of Equation (12). Block 2112 represents the process of finding maximum $|I_p^+|$ being repeated for the revised reactive currents.

In some cases, Blocks 2108 and 2112 can be performed either in parallel with Block 2106, or sequentially after Block 2106. This is because the output can be obtained either at Block 2108 (if $|I_p^+|\notin\varnothing$) or Block 2112 (if $|I_p^+|\in\varnothing$). In the block diagram of FIG. 21, the parallel approach is implemented. Depending on the "Initial Null $|I_p^+|$ Flag", either the references currents of Blocks 2104 and 2106 or the reference currents of Blocks 2108 and 2110 are passed to the inverter.

Figure 22:
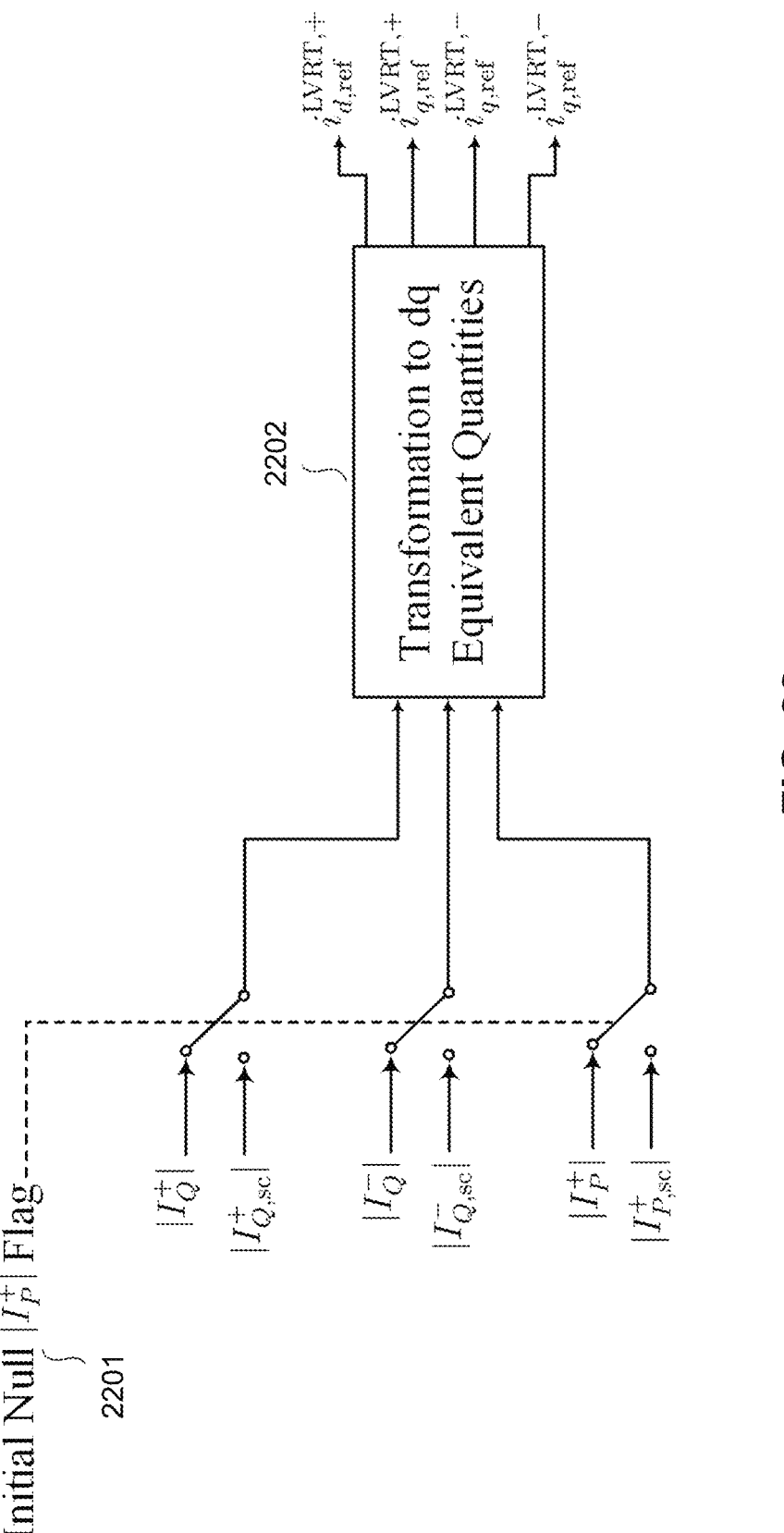

In FIG. 22, an Initial Null $|I_p^+|$ Flag at block 2201 allows switching between the active/reactive currents and the revised active/reactive current. In Block 2102, the sequence active and reactive components are transformed to their associated dq quantities.

The current limitation approach, for example represented by Blocks 2108 and 2110, and that uses Equations (14) and (12), assumes that the reactive positive- and negative-sequence currents are uniformly scaled down. However, it is to be understood that the present embodiments can be used with other current limitation strategies. The following current limitation strategy examples describe changes required in the above formulations and equations in order to implement these current limitation strategies; any of which may be used as appropriate.

In a first example current limitation strategy, non-uniform scaling of the sequence reactive currents can be performed when the negative-sequence reactive current is to be decreased at a higher rate. In this case, a new parameter $\gamma^-$ s.t. $0<\gamma^-<1$ is selected. The smaller is $\gamma^-$, the higher is the reduction rate of $\Delta I_Q^-$ (compared with the reduction rate of $\Delta I_Q^+$). In order to make sure that the selected $\gamma^-$ does not cause the maximum phase current to fall below $I_{max}$, a lower bound for $\gamma^-$, i.e., $\gamma_L^-$, is determined. $\gamma_L^-$ should satisfy $0<\gamma_L^-<1$ and Equation (26) such that $\max\{|I_a|, |I_b|, |I_c|\}=I_{max}$.

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix} \begin{bmatrix} (|\pm|I_{Q\text{-}pre}^+|+\Delta I_Q^+| - |\Delta I_{Q\text{-}cap}^+|)\angle\left(\theta_{V^+} - \frac{\pi}{2}\right) \\ (\gamma_L^-\Delta I_Q^- + |I_{Q\text{-}cap}^-|)\angle\left(\theta_{V^-} + \frac{\pi}{2}\right) \end{bmatrix} \qquad (26)$$

29

In order to calculate $\gamma_L^-$, for any phase current which was above the limit for the original superimposed reactive currents, i.e., $\Delta I_Q^\pm$, the respective Equation (27) has to be solved.

$$I_{max}^2 = \sigma_{2\varphi}^-(\gamma_L^-)^2 + \sigma_{1\varphi}^-\gamma_L^- + \sigma_{0\varphi}^- \tag{27}$$

Where $\sigma_{2\varphi}^-$, $\sigma_{1\varphi}^-$, $\sigma_{0\varphi}^-$, can be obtained by Equation (28):

$$\sigma_{2\varphi}^- = (\Delta I_Q^-)^2 \tag{28}$$

$$\sigma_{1\varphi}^- = 2(\pm|I_{Q-pre}^+| + \Delta I_Q^+| - |I_{Q-cap}^+|)\Delta I_Q^- \cos(\beta + \varphi) + 2\Delta I_Q^-|I_{Q-cap}^-|$$

$$\sigma_{0\varphi}^- = (|\pm|I_{Q-pre}^+| + \Delta I_Q^+| - |I_{Q-cap}^+|)^2 +$$

$$|I_{Q-cap}^-|^2 + 2(|\pm|I_{Q-pre}^+| + \Delta I_Q^+| - |I_{Q-cap}^+|)|I_{Q-cap}^-|\cos(\beta + \varphi)$$

Then, the minimum of the acceptable answers is taken. If, at least, one of the phases which was originally above the limit has no acceptable answer, then the lower bound will be zero, i.e., $\gamma_L^-=0$. Then, the selected $\gamma^-$ is compared with the calculated $\gamma_L^-$. If $\gamma^-<\gamma_L^-$, then $\gamma^-=\gamma_L^-$. Using Equation (29), $\rho$ is found such that $\max\{|I_a|, |I_b|, |I_c|\}=I_{max}$:

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix}\begin{bmatrix} (|\pm|I_{Q-pre}^+| + \rho\Delta I_Q^+| - |I_{Q-cap}^+|)\angle(\theta_{V^+} - \frac{\pi}{2}) \\ (\rho\gamma_L^-\Delta I_Q^- + |I_{Q-cap}^-|)\angle(\theta_{V^-} + \frac{\pi}{2}) \end{bmatrix} \tag{29}$$

Which requires solving Equation (30):

$$I_{max}^2 = \xi_{2\varphi}^-\rho^2 + \xi_{1\varphi}^-\rho + \xi_{0\varphi}^- \tag{30}$$

While the coefficients $\xi_{2\varphi}^-$, $\xi_{1\varphi}^-$, $\xi_{0\varphi}^-$ are obtained by Equation (31):

$$\xi_{2\varphi}^- = (\Delta I_Q^+)^2 + 2\mu\gamma^-\Delta I_Q^+\Delta I_Q^-\cos(\beta + \varphi) + (\gamma^-\Delta I_Q^-)^2 \tag{31}$$

$$\xi_{1\varphi}^- = 2\Delta I_Q^+|I_{Q-cap}^+| \pm 2\mu|I_{Q-pre}^+|\Delta I_Q^+ + 2\gamma^-\Delta I_Q^-|I_{Q-cap}^-| +$$

$$(\mp 2\mu\gamma^-|I_{Q-pre}^+|\Delta I_Q^- + 2\mu\Delta I_Q^+|I_{Q-cap}^-|2\gamma^-|I_{Q-pre}^+|\Delta I_Q^-)\cos(\beta + \varphi)$$

$$\xi_{0\varphi}^- = |I_{Q-pre}^+|^2 \pm 2\mu|I_{Q-pre}^+||I_{Q-cap}^+| + |I_{Q-cap}^+|^2 +$$

$$|I_{Q-cap}^-|^2 + (\mp 2\mu|I_{Q-pre}^+||I_{Q-cap}^-| - 2|I_{Q-cap}^+||I_{Q-cap}^-|)\cos(\beta + \varphi)$$

The proper selection for $\mu$, $\pm$ and $\mp$ signs, and the optimal $\rho$ is the same as described with respect to Equations (14) and (15). The scaled superimposed reactive currents will thus be $\rho\Delta I_Q^+$ and $\rho\gamma^-\Delta I_Q^-$.

In a second example current limitation strategy, non-uniform scaling of the sequence reactive currents can be performed when the positive-sequence reactive current is to be decreased at a higher rate. Similar to the first example current limitation strategy, a new parameter $\gamma^+$ s.t. $0<\gamma^+<1$ is selected. The smaller the $\gamma^+$, the higher the reduction rate of $\Delta I_Q^+$ (compared with the reduction rate of $\Delta I_Q^-$). In order to make sure that the selected $\gamma^+$ does not cause the maximum phase current to fall below $I_{max}$, a lower bound for $\gamma^+$, i.e., $\gamma_L^+$, is determined. $\gamma_L^+$ should satisfy $0<\gamma_L^+<1$ and Equation (32) such that $\max\{|I_a|, |I_b|, |I_c|\}=I_{max}$.

30

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix}\begin{bmatrix} |\pm|I_{Q-pre}^+| + \gamma_L^+\Delta I_Q^+| - |I_{Q-cap}^+|)\angle(\theta_{V^+} - \frac{\pi}{2}) \\ (\Delta I_Q^- + |I_{Q-cap}^-|)\angle(\theta_{V^-} + \frac{\pi}{2}) \end{bmatrix} \tag{32}$$

In order to calculate $\gamma_L^+$, for any phase current which was above the limit for the original superimposed reactive currents, i.e., $\Delta I_Q^\pm$, the respective Equation (33) has to be solved:

$$I_{max}^2 = \sigma_{2\varphi}^+(\gamma_L^+)^2 + \sigma_{1\varphi}^+\gamma_L^+ + \sigma_{0\varphi}^+ \tag{33}$$

$\sigma_{2\varphi}^+$, $\sigma_{1\varphi}^+$, $\sigma_{0\varphi}^+$, can be obtained by Equation (34) when $\pm|I_{Q-pre}^+|+\Delta I_Q^+\geq 0$ (for capacitive and inductive $|I_{Q-pre}^+|$, the lower and upper signs in $\pm$ is applied, respectively):

$$\sigma_{2\varphi}^+ = (\Delta I_Q^+)^2 \tag{34}$$

$$\sigma_{1\varphi}^+ = -2\Delta I_Q^+(\mp|I_{Q-pre}^+| - |I_{Q-pre}^+|) - 2\Delta I_Q^+(\Delta I_Q^- + |I_{Q-cap}^-|)\cos(\beta + \varphi)$$

$$\sigma_{0\varphi}^+ = (\mp|I_{Q-pre}^+| - |I_{Q-cap}^+|)^2 +$$

$$2(\mp|I_{Q-pre}^+| - |I_{Q-cap}^+|)(\Delta I_Q^- + |I_{Q-cap}^-|)\cos(\beta + \varphi) + (\Delta I_Q^- + |I_{Q-cap}^-|)^2$$

Then, the minimum of the acceptable answers is used. If, at least, one of the phases which was originally above the limit has no acceptable answer, then the lower bound will be zero, i.e., $\gamma_L^+=0$. Then, the selected $\gamma^+$ is compared with the calculated $\gamma_L^+$. If $\gamma^+<\gamma_L^+$, then $\gamma^+=\gamma_L^+$. Using Equation (35), $\rho$ is found such that $\max\{I_a|, |I_b|, |I_c|\}=I_{max}$:

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix}\begin{bmatrix} (|\pm|I_{Q-pre}^+| + \rho\gamma^+\Delta I_Q^+| - |I_{Q-cap}^+|)\angle(\theta_{V^+} - \frac{\pi}{2}) \\ (\rho\Delta I_Q^- + |I_{Q-cap}^-|)\angle(\theta_{V^-} + \frac{\pi}{2}) \end{bmatrix} \tag{35}$$

Which entails solving Equation (36):

$$I_{max}^2 = \xi_{2\varphi}^+\rho^2 + \xi_{1\varphi}^+\rho + \xi_{0\varphi}^+ \tag{36}$$

While the coefficients $\xi_{2\varphi}^+$, $\xi_{1\varphi}^+$, $\xi_{0\varphi}^+$ are obtained by Equation (37):

$$\xi_{2\varphi}^+ = (\gamma^+\Delta I_Q^+)^2 + 2\mu\gamma^+\Delta I_Q^+\Delta I_Q^-\cos(\beta + \varphi) + (\Delta I_Q^-)^2 \tag{37}$$

$$\xi_{1\varphi}^+ - 2\gamma^+\Delta I_Q^+|I_{Q-cap}^+| \pm 2\mu\gamma^+|I_{Q-pre}^+|\Delta I_Q^+ + 2\Delta I_Q^-|I_{Q-cap}^-| +$$

$$(\mp 2\mu|I_{Q-pre}^+|\Delta I_Q^- + 2\mu\gamma^+\Delta I_Q^+|I_{Q-cap}^-| - 2|I_{Q-cap}^+|\Delta I_Q^-)\cos(\beta + \varphi)$$

$$\xi_{0\varphi}^+ = |I_{Q-pre}^+|^2 \pm 2\mu|I_{Q-pre}^+||I_{Q-cap}^+| + |I_{Q-cap}^+|^2 +$$

$$|I_{Q-cap}^-|^2 + (\mp 2\mu|I_{Q-pre}^+||I_{Q-cap}^-| - 2|I_{Q-cap}^+||I_{Q-cap}^-|)\cos(\beta + \varphi)$$

The proper selection for $\mu$, $\pm$ and $\mp$ signs, and the optimal $\rho$ is the same as described with respect to Equations (14) and (15). The scaled superimposed reactive currents will thus be $\rho\gamma^+\Delta I_Q^+$ and $\rho\Delta I_Q^-$.

In a third example current limitation strategy, non-uniform scaling of the sequence reactive currents can be performed when the positive-sequence reactive current is to be decreased at a higher rate, while avoiding the superimposed positive-sequence reactive current becoming smaller than the superimposed negative-sequence reactive current. All the steps of the second example current limitation strategy are followed. However, at the end, if $-\rho\gamma^{+}\Delta I_{Q}^{+}\geq\rho\Delta I_{Q}^{-}$, no further action is required; otherwise $\Delta I_{Q}^{+}$ is selected to be equal to $-\Delta I_{Q}^{-}$ and the approach of uniform scale down of the sequence reactive currents, as described herein with respect to Equations (12) to (15), is repeated.

In a fourth example current limitation strategy, optimized non-uniform scaling of the reactive currents are performed when the negative-sequence reactive current is to be decreased at a higher rate. A new parameter $\gamma^{-}$ s.t. $0<\gamma^{-}<1$ is selected. The following optimization problem is solved to find a lower bound for $\gamma^{-}$, i.e., $\gamma_{L}^{-}$:

Max $\gamma_{L}^{-}$
s.t.

$$0 < \gamma_{L}^{-} < 1 \qquad (38)$$

$$|I_{P}^{+}| \geq 0$$

$$\left[\pm|I_{Q-pre}^{+}| + \Delta I_{Q}^{+}| - |I_{Q,Cap}^{+}| + \left(\gamma_{L}^{-}\Delta I_{Q}^{-} + |I_{Q,Cap}^{-}|\right)\cos(\beta+\varphi)\right]^{2} +$$
$$\left[|I_{P}^{+}| + \left(\gamma_{L}^{-}\Delta I_{Q}^{-} + |I_{Q,Cap}^{-}|\right)\sin(\beta+\varphi)\right]^{2} \leq I_{max}^{2}$$

If the optimization problem is infeasible, then $\gamma_{L}^{-}=0$. The selected $\gamma^{-}$ is compared with the calculated $\gamma_{L}^{-}$. If $\gamma^{-}<\gamma_{L}^{-}$, then $\gamma^{-}=\gamma_{L}^{-}$. Then, the following optimization problem is solved:

Max $\rho$
s.t.

$$0 < \rho < 1 \qquad (39)$$

$$|I_{P}^{+}| \geq 0$$

$$\left[\pm|I_{Q,pre}^{+}| + \rho\Delta I_{Q}^{+}| - |I_{Q,Cap}^{+}| + \left(\gamma^{-}\rho\Delta I_{Q}^{-} + |I_{Q,Cap}^{-}|\right)\cos(\beta+\varphi)\right]^{2}$$
$$\left[|I_{P}^{+}| + \left(\gamma^{-}\rho\Delta I_{Q}^{-} + |I_{Q,Cap}^{-}|\right)\sin(\beta+\varphi)\right]^{2} \leq I_{max}^{2}$$

The scaled superimposed reactive currents will then be $\rho\Delta I_{Q}^{+}$ and $\rho\gamma^{-}\Delta I_{Q}^{-}$.

In a fifth example current limitation strategy, optimized non-uniform scaling of the reactive currents is performed when the positive-sequence reactive current is to be decreased at a higher rate. A new parameter $\gamma^{+}$ s.t. $0<\gamma^{+}<1$ is selected. The following optimization problem is solved to find a lower bound for $\gamma^{+}$, i.e., $\gamma_{L}^{+}$:

Max $\gamma_{L}^{+}$
s.t.

$$0 < \gamma_{L}^{+} < 1 \qquad (40)$$

$$|I_{P}^{+}| \geq 0$$

$$\left[\pm|I_{Q,pre}^{+}| + \gamma_{L}^{+}\Delta I_{Q}^{+}| - |I_{Q,Cap}^{+}| + \left(\Delta I_{Q}^{-} + |I_{Q,Cap}^{-}|\right)\cos(\beta+\varphi)\right]^{2} +$$
$$\left[|I_{P}^{+}| + \left(\Delta I_{Q}^{-} + |I_{Q,Cap}^{-}|\right)\sin(\beta+\varphi)\right]^{2} \leq I_{max}^{2}$$

If the optimization problem is infeasible, then $\gamma_{L}^{+}=0$. The selected $\gamma^{+}$ is compared with the calculated $\gamma_{L}^{+}$. If $\gamma^{+}<\gamma_{L}^{+}$, then $\gamma^{+}=\gamma_{L}^{+}$. Then, the following optimization problem is solved:

Max $\rho$
s.t.

$$0 < \rho < 1 \qquad (41)$$

$$|I_{P}^{+}| \geq 0$$

$$\left[\pm|I_{Q,pre}^{+}| + \rho\gamma^{+}\Delta I_{Q}^{+}| - |I_{Q,Cap}^{+}| + \left(\rho\Delta I_{Q}^{-} + |I_{Q,Cap}^{-}|\right)\cos(\beta+\varphi)\right]^{2} +$$
$$\left[|I_{P}^{+}| + \left(\rho\Delta I_{Q}^{-} + |I_{Q,Cap}^{-}|\right)\sin(\beta+\varphi)\right]^{2} \leq I_{max}^{2}$$

The scaled superimposed reactive currents will then be $\rho\gamma^{+}\Delta I_{Q}^{+}$ and $\rho\Delta I_{Q}^{-}$.

In a sixth example current limitation strategy, optimized non-uniform scaling of the sequence reactive currents is performed when the positive-sequence reactive current is to be decreased at a higher rate, while avoiding the superimposed positive-sequence reactive current to become smaller than the superimposed negative-sequence reactive current. All the steps of the fifth example current limitation strategy are followed. At the end, if $-\rho\gamma^{+}\Delta I_{Q}^{+}\geq\rho\Delta I_{Q}^{-}$, no further action is required; otherwise $\Delta I_{Q}^{+}$ is selected equal to $-\Delta I_{Q}^{-}$ and the optimization of uniform scale down of the sequence reactive currents, described with respect to Equations (21) to (23), is repeated.

In a seventh example current limitation strategy, prioritized scaling of the reactive currents is performed when the negative-sequence current is to be decreased first. $\gamma_{L}^{-}$ is determined as described with respect to the first example current limitation strategy. If it exists, then the scaled reactive currents are $\Delta I_{Q}^{+}$ and $\gamma_{L}^{-}\Delta I_{Q}^{-}$, and no further action is required. Otherwise, $\gamma_{L}^{+}$ is calculated as described with respect to the second example current limitation strategy; while $\Delta I_{Q}^{-}$ in Equations (34) and (35) is set to zero. The scaled superimposed positive- and negative-sequence reactive currents will then be $\gamma_{L}^{+}\Delta I_{Q}^{+}$ and zero, respectively. Note that this strategy may cause the IBR to generate zero superimposed negative-sequence current. If this is undesired, a limit may be applied to the reduction of $\Delta I_{Q}^{-}$, e.g., $\Delta I_{Q,lim}^{-}$. If $\gamma_{L}^{-}$ exists and $$\gamma_{L}^{-} \geq \frac{\Delta I_{Q,lim}^{-}}{\Delta I_{Q}^{-}},$$

then the scaled superimposed reactive currents are $\Delta I_{Q}^{+}$ and $\gamma_{L}^{-}\Delta I_{Q}^{-}$, and no further action is required. Otherwise, $\gamma_{L}^{+}$ is determined as described in the second example current limitation strategy; while $\Delta I_{Q}^{-}$ in Equations (34) and (35) is substituted by $\Delta I_{Q,lim}^{-}$. The scaled superimposed positive- and negative-sequence reactive currents will then be $\gamma_{L}^{+}\Delta I_{Q}^{+}$ and $\Delta I_{Q,lim}^{-}$, respectively.

In an eighth example current limitation strategy, prioritized scaling of the reactive currents is performed when the positive-sequence current is to be decreased first. $\gamma_{L}^{+}$ is calculated as described with respect to the second example current limitation strategy. If it exists, then the scaled reactive currents are $\gamma_{L}^{+}\Delta I_{Q}^{+}$ and $\Delta I_{Q}^{-}$, and no further action is required. Otherwise, $\gamma_{L}^{-}$ is calculated as described with respect to the first example current limitation strategy; while $\Delta I_{Q}^{+}$ in Equation (28) is set to zero. The scaled superimposed positive- and negative-sequence reactive currents will then be zero and $\gamma_{L}^{-}\Delta I_{Q}^{-}$, respectively. Note that this strategy may cause the IBR to generate zero superimposed positive-sequence reactive current (which may cause the IBR's phase rotation). If this is undesired, a limit may be applied to the reduction of $\Delta I_Q^+$, e.g., $\Delta I_{Q,lim}^+$. If $\gamma_L^+$ exists and $$\gamma_L^+ \geq \frac{\Delta I_{Q,lim}^+}{\Delta I_Q^+},$$

then the scaled superimposed reactive currents are $\gamma_L^+ \Delta I_Q^+$ and $\Delta I_Q^-$, and no further action is required. Otherwise, $\gamma_L^-$ is calculated as described with respect to the first example current limitation strategy; while $\Delta I_Q^+$ in Equation (28) is substituted by $\Delta I_{Q,lim}^+$. The scaled superimposed positive- and negative-sequence reactive currents will then be $\Delta I_{Q,lim}^+$ and $\gamma_L^- \Delta I_Q^-$, respectively.

In a ninth example current limitation strategy, optimized prioritized scaling of the reactive currents is performed when the negative-sequence current is to be decreased first. $\gamma_L^-$ is determined as described with respect to the fourth example current limitation strategy. If it exists, then the scaled reactive currents are $\Delta I_Q^+$ and $\gamma_L^- \Delta I_Q^-$, and no further action is required. Otherwise, $\gamma_L^+$ is determined as described with respect to the fifth example current limitation strategy; while $\Delta I_Q^-$ in the optimization problem of Equation (40) is set to zero. The scaled superimposed positive- and negative-sequence reactive currents will then be $\gamma_L^+ \Delta I_Q^+$ and zero, respectively. Note that this strategy may cause the IBR to generate zero superimposed negative-sequence current. If this is undesired, a limit may be applied to the reduction of $\Delta I_Q^-$, e.g., $\Delta I_{Q,lim}^-$. If $\gamma_L^-$ exists and $$\gamma_L^- \geq \frac{\Delta I_{Q,lim}^-}{\Delta I_Q^-},$$

then the scaled superimposed reactive currents are $\Delta I_Q^+$ and $\gamma_L^- \Delta I_Q^-$, and no further action is required. Otherwise, $\gamma_L^+$ is calculated as described with respect to the fifth example current limitation strategy; while $\Delta I_Q^-$ in the optimization problem of Equation (40) has been substituted by $\Delta I_{Q,lim}^-$. The scaled superimposed positive- and negative-sequence reactive currents will then be $\gamma_L^+ \Delta I_Q^+$ and $\Delta I_{Q,lim}^-$, respectively.

In a tenth example current limitation strategy, optimized prioritized scaling of the reactive currents is performed when the positive-sequence current is to be decreased first. $\gamma_L^+$ is determined as described with respect to the fifth example current limitation strategy. If it exists, then the scaled reactive currents are $\gamma_L^+ \Delta I_Q^+$ and $\Delta I_Q^-$, and no further action is required. Otherwise, $\gamma_L^-$ is calculated as described with respect to the fourth example current limitation strategy; while $\Delta I_Q^+$ in the optimization problem of Equation (38) is set to zero. The scaled superimposed positive- and negative-sequence reactive currents will then be zero and $\gamma_L^- \Delta I_Q^-$, respectively. Note that this strategy may cause the IBR to generate zero superimposed positive-sequence reactive current (which may cause the IBR's phase rotation). If this is undesired, a limit may be applied to the reduction of $\Delta I_Q^+$, e.g., $\Delta I_{Q,lim}^+$. If $\gamma_L^+$ exists and $$\gamma_L^+ \geq \frac{\Delta I_{Q,lim}^+}{\Delta I_Q^+},$$

then the scaled superimposed reactive currents are $\gamma_L^+ \Delta I_Q^+$ and $\Delta I_Q^-$, and no further action is required. Otherwise, $\gamma_L^-$ is determined as described with respect to the fourth example current limitation strategy; while $\Delta I_Q^+$ in the optimization problem of Equation (38) has been substituted by $\Delta I_{Q,lim}^+$. The scaled superimposed positive- and negative-sequence reactive currents will then be $\Delta I_{Q,lim}^+$ and $\gamma_L^- \Delta I_Q^-$, respectively.

Figure 23:
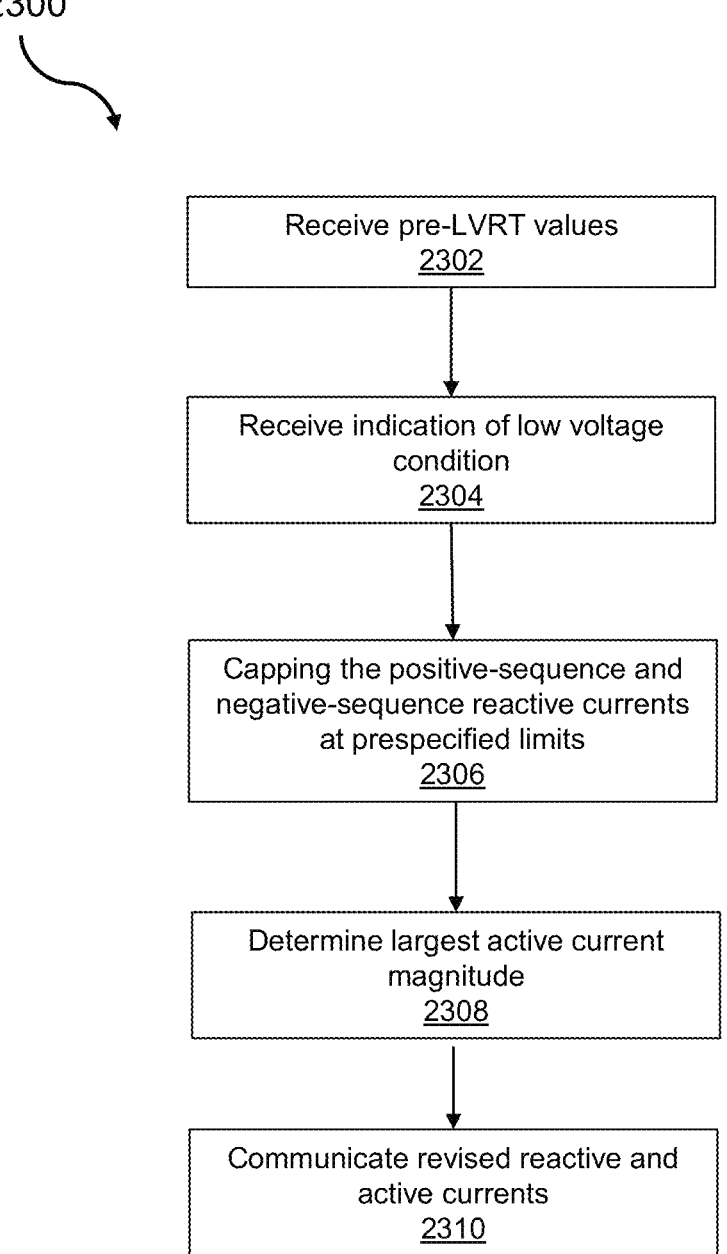
FIG. 23 shows a diagrammatic flowchart for a method for determining active and reactive currents during asymmetrical LVRT conditions, according to an example embodiment.

In an eleventh example current limitation strategy, as exemplified in the flowchart of FIG. 23, after receiving the pre-LVRT values (block 2302) and receiving an indication of a low voltage condition (block 2304), the positive- and negative-sequence reactive currents are capped at prespecified limits (block 2306) such that the phase currents do not violate their limit; e.g., $|I_Q^+| \leq I_{lim}^+$, $|I_Q^-| \leq I_{lim}^-$ and $I_{lim}^+ + I_{lim}^- \leq I_{max}$. In this example current limitation strategy, after capping $|I_Q^+|$ and $|I_Q^-|$ at their respective limits, the capped reactive currents are plugged into Equation (10) to calculate the maximum $|I_p^+|$ (block 2308) using the approach described with respect to Equations (3) to (10). After which, at block 2310, the revised reactive and active currents are communicated to the inverter. In this example current limitation strategy, the applied assumptions of $|I_Q^+| \leq I_{lim}^+$, $|I_Q^-| \leq I_{lim}^-$ and $I_{lim}^+ + I_{lim}^- \leq I_{max}$ necessarily cause all the phase currents to be below $I_{max}$. Therefore, in some cases, some aspects can be omitted, such as those addressing the violation of phase current limit due to large sequence reactive currents; such as scaling down of each of the positive-sequence and negative-sequence reactive currents and determining of a non-zero positive-sequence revised active current.

In a twelfth example current limitation strategy, when Equation (10) returns an empty set (if it does not return an empty set, then no current limitation needs to be performed), the positive- and negative-sequence reactive currents are capped at prespecified limits; e.g., $|I_Q^+| \leq I_{lim}^+$, $|I_Q^-| \leq I_{lim}^-$ and $I_{lim}^+ + I_{lim}^- \leq I_{max}$. In this example current limitation strategy, after capping 11 and $|I_Q^-|$ at their respective limits, the capped reactive currents are then plugged into Equation (10) to calculate the revised maximum $|I_p^+|$ using the approach described with respect to Equations (3) to (10).

In further cases, at least some of the present equations can be augmented, as appropriate, for simplicity. Equation (2), provided herein, can be augmented to:

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix}$$

$$\begin{bmatrix} \left( \pm |I_{Q-pre}^+| - \Delta I_Q^+ \right) \angle \left( \theta_{V^+} - \frac{\pi}{2} \right) + |I_{Q-cap}^+| \angle \left( \theta_{V^+} + \frac{\pi}{2} \right) + |I_P^+| \angle (\theta_{V^+}) \\ \Delta I_Q^- \angle \left( \theta_{V^-} + \frac{\pi}{2} \right) + |I_{Q-cap}^-| \angle \left( \theta_{V^-} + \frac{\pi}{2} \right) \end{bmatrix}$$

Equation (4), provided herein, can be augmented to:

$$|I_Q^+| = \left( \pm |I_{Q-pre}^+| - \Delta I_Q^+ \right) - |I_{Q-cap}^+|$$

Equation (12), provided herein, can be augmented to:

$$\begin{bmatrix} I_a \\ I_b \\ I_c \end{bmatrix} = \begin{bmatrix} 1 & 1 \\ \alpha^2 & \alpha \\ \alpha & \alpha^2 \end{bmatrix} \begin{bmatrix} (\pm|I_{Q-pre}^+| - \rho\Delta I_Q^+ - |I_{Q-cap}^+|)\angle\left(\theta_{V^+} - \frac{\pi}{2}\right) \\ (\rho\Delta I_Q^- + |I_{Q-cap}^-|)\angle\left(\theta_{V^-} + \frac{\pi}{2}\right) \end{bmatrix}$$

Equation (13), provided herein, can be augmented to:

$$I_{max}^2 = (\pm|I_{Q-pre}^+| - \rho\Delta I_Q^+ - |I_{Q-cap}^+|)^2 + (\rho\Delta I_Q^- + |I_{Q-cap}^-|)^2 +$$
$$2(\pm|I_{Q-pre}^+| - \rho\Delta I_Q^+ - |I_{Q-cap}^+|)(\rho\Delta I_Q^- + |I_{Q-cap}^-|)\cos(\beta + \varphi)$$

Equation (15), provided herein, can be augmented to:

$$\lambda_{2\varphi} = (\Delta I_Q^+)^2 - 2\Delta I_Q^+ \Delta I_Q^- \cos(\beta + \varphi) + (\Delta I_Q^-)^2$$

$$\lambda_{1\varphi} = 2\Delta I_Q^+|I_{Q-cap}^+| \mp 2|I_{Q-pre}^+|\Delta I_Q^+ + 2\Delta I_Q^-|I_{Q-cap}^-| +$$
$$(\pm 2|I_{Q-pre}^+|\Delta I_Q^- - 2\Delta I_Q^+|I_{Q-cap}^-| - 2|I_{Q-cap}^+|\Delta I_Q^-)\cos(\beta + \varphi)$$

$$\lambda_{0\varphi} = |I_{Q-pre}^+|^2 \mp 2|I_{Q-pre}^+||I_{Q-cap}^+| + |I_{Q-cap}^+|^2 +$$
$$|I_{Q-cap}^-|^2 + (\pm 2|I_{Q-pre}^+||I_{Q-cap}^-| - 2|I_{Q-cap}^+||I_{Q-cap}^-|)\cos(\beta + \varphi)$$

As shown, in the above augmented versions of Equations (12), (13), and (15), the scaling of the reactive currents have been modified. Additionally, in the above augmented version of Equation (15), for capacitive and inductive pre-fault reactive currents, the upper and lower signs, respectively, must be used in ± and ∓.

Several reference frames can be adopted for the implementation of inverters' control, such as a synchronous reference frame (dq), stationary reference frame (αβ), or natural reference frame (abc). FIGS. 18 to 22 illustrate, as an example, the implementation in dq reference frame; however any suitable reference frame can be used.

As described herein, existing approaches to inverter control do not satisfy the requirements of most GCs for maximum active and reactive current generation during LVRT. These techniques use the scalar sum of the sequence currents to derive the inverter reference currents, leading to miscalculation of an IBR's capacity for generating active current. This may also cause unnecessary scale down of the reactive currents without any active current generation. The present embodiments address at least these problems and maximizes both active and reactive currents of an IBR. In particular, the example experiments show that when the reactive currents make the phase currents exceed the IBR's limit, the system 100 may be able to generate non-negligible amounts of active current and bring the phase currents below their limit without scaling down the reactive currents. Additionally, the system 100 can derive a larger scaling factor and so maximize the reactive current generated by the IBR. Additionally, after scaling down the reactive currents, although at least one of the phase currents reaches the IBR's limit, the BR is still usually capable of generating active current.

While the above disclosure generally describes the present embodiments applied to the application of a power inverter, it is appreciated that the presently described approaches can be applied to any suitable application; for example, applied to applications of high-voltage direct current (HVDC) stations. In other cases, the presently described approaches can be incorporated into fault determination software or model that uses the present embodiments to determine active and/or reactive currents. Fault determination software generally requires a software model of an inverter that complies with applicable grid codes and standards. This model can be integrated with models of other power system components (for example, transmission lines, conventional power plants, protective relays, and the like) to calculate the currents and voltages in different parts of the system during fault (i.e., LVRT) conditions. Utility engineers can use the results of these calculations to set up protective devices of the electrical grid. The software model generally receives one or more inputs described herein (e.g., LVRT voltage, pre-LVRT currents, current limitation strategy, K-factor, and the like) and outputs three-phase currents that would be generated by a code-compliant inverter.

Although the foregoing has been described with reference to certain specific embodiments, various modifications thereto will be apparent to those skilled in the art without departing from the spirit and scope of the invention as outlined in the appended claims. The entire disclosures of all references recited above are incorporated herein by reference.

The invention claimed is:

1. A method for determining active and reactive currents during asymmetrical low-voltage ride through (LVRT) conditions at an inverter, the method executable on a controller or executed as a model on a computer, the method comprising:

receiving an indication of an LVRT condition; and where there is an active current such that the largest phase current magnitude does not exceed a phase current limit, determining a maximum active current for associated positive-sequence and negative-sequence reactive currents by determining a largest active current magnitude and outputting the largest active current and associated positive-sequence and negative-sequence reactive currents to the inverter, otherwise:

scaling down each of the positive-sequence and negative-sequence reactive currents, or superimposed positive-sequence and negative-sequence reactive currents, to determine revised positive-sequence and negative-sequence reactive currents;

where the magnitudes of all of the phase currents are below the phase current limit and a β condition for each phase after the scaling down is within a predetermined range, determining non-zero positive-sequence revised active current, the β condition based on a negative voltage angle ($\theta_{V^-}$) and a positive voltage angle ($\theta_{V^+}$); and outputting the revised active current and the revised positive-sequence and negative-sequence reactive currents to the inverter.

2. The method of claim 1, wherein determining whether there is an active current such that the largest phase current magnitude does not exceed a phase current limit comprises determining a maximum active current by determining ranges for the active current such that each phase current does not exceed the phase current limit and selecting the upper bound of the range.

3. The method of claim 1, wherein the β condition equals $\pi + \theta_{V^-} - \theta_{V^+}$, and wherein the predetermined range is $180° < \beta < 360°$ if the phase current of an A-phase is equal to the phase current limit after the scaling down, the predetermined range is $180° < \beta + 120° < 360°$ if the phase current of a B-phase is equal to the phase current limit after the scaling down, or the predetermined range is 180°<β+120°<360° if the phase current of a C-phase is equal to the phase current limit after the scaling down.

4. The method of claim 1, wherein scaling down each of the positive- sequence and negative-sequence reactive currents comprises scaling uniformly based on a change in the positive-sequence and negative-sequence reactive currents or uniformly scaling by determining a scaling factor that causes at least one of the phase currents equal to the phase current limit.

5. The method of claim 4, wherein determining the scaling factor comprises:

determining all of the possible solutions for the scaling factor using a quadratic relationship to the phase current limit;

discarding any solutions to the scaling factor that are outside of the [0,1] range; and selecting a largest solution to the scaling factor that makes at least one of the phases equal to or below the phase current limit and the other phases below the phase current limit.

6. The method of claim 1, wherein determining the non-zero positive-sequence revised active current comprises determining a magnitude of an active current that satisfies the relationship of $|I_{\varphi}|=I_{max}=\sqrt{|I_x|^2+|I_y|^2}$, where $I_x$ comprises the positive-sequence reactive current ($I_Q^+$) and the angle between the positive-sequence reactive current and either the negative-sequence reactive current (β), the negative-sequence reactive current (β) minus 2π/3, or the negative-sequence reactive current (β) plus 2π/3, and $I_y$ comprises the negative-sequence reactive current ($I_Q^-$) and the angle between the positive-sequence reactive current and either the negative-sequence reactive current (β), the negative-sequence reactive current (β) minus 2π/3, or the negative-sequence reactive current (β) plus 2π/3.

7. The method of claim 1, wherein scaling down each of the positive-sequence and negative-sequence reactive currents comprises non-uniform scaling where:

the negative-sequence reactive current is decreased at a higher rate than the positive-sequence reactive current, the positive-sequence reactive current is decreased at a higher rate than the negative-sequence reactive current, or the positive-sequence reactive current is decreased at a higher rate than the negative-sequence reactive current and superimposed positive-sequence reactive currents are greater than superimposed negative-sequence reactive currents.

8. The method of claim 1, wherein scaling down each of the positive-sequence and negative-sequence reactive currents comprises non-uniform scaling using optimization, where:

the negative-sequence reactive current is decreased at a higher rate than the positive-sequence reactive current, the positive-sequence reactive current is decreased at a higher rate than the negative-sequence reactive current, or the positive-sequence reactive current is decreased at a higher rate than the negative-sequence reactive current and superimposed positive-sequence reactive currents are greater than superimposed negative-sequence reactive currents.

9. The method of claim 1, wherein scaling down each of the positive-sequence and negative-sequence reactive currents comprises non-uniform scaling where the negative-sequence current is prioritized to be decreased before the positive-sequence current or where the positive-sequence current is prioritized to be decreased before the negative-sequence current.

10. The method of claim 1, wherein scaling down each of the positive-sequence and negative-sequence reactive currents comprises non-uniform scaling using optimization, where the negative-sequence current is prioritized to be decreased before the positive-sequence current or where the positive-sequence current is prioritized to be decreased before the negative-sequence current.

11. A system for determining active and reactive currents during asymmetrical low-voltage ride through (LVRT) conditions at an inverter, the system comprising a processing unit in communication with a non-transitory computer-readable medium comprising instructions to cause the processing unit to execute:

receiving of an indication of an LVRT condition;

where there is an active current such that the largest phase current magnitude does not exceed a phase current limit, determining a maximum active current for associated positive-sequence and negative-sequence reactive currents by determining a largest active current magnitude;

where there is an active current such that the largest phase current magnitude does not exceed the phase current limit, outputting the largest active current and associated positive-sequence and negative-sequence reactive currents to the inverter;

where there is no active current such that the largest phase current magnitude does not exceed the phase current limit, scaling down each of the positive-sequence and negative-sequence reactive currents, or superimposed positive-sequence and negative-sequence reactive currents, to determine revised positive-sequence and negative-sequence reactive currents;

where there is no active current such that the largest phase current magnitude does not exceed the phase current limit and a β condition for each phase after the scaling down is within a predetermined range, determining a non-zero positive-sequence revised active current where the magnitudes of all of the phase currents are below the phase current limit, the β condition based on a negative voltage angle ($\theta_{V^-}$) and a positive voltage angle ($\theta_{V^+}$); and output the revised active currents and the revised positive-sequence and negative-sequence reactive currents to the inverter.

12. The system of claim 11, wherein determining whether there is an active current such that the largest phase current magnitude does not exceed a phase current limit comprises determining a maximum active current by determining ranges for the active current such that each phase current does not exceed the phase current limit and selecting the upper bound of the range.

13. The system of claim 11, wherein the β condition equals π+$\theta_{V^-}$−$\theta_{V^+}$, and wherein the predetermined range is 180°<β<360° if the phase current of an A-phase is equal to the phase current limit after the scaling down, the predetermined range is 180°<β−120°<360° if the phase current of a B-phase is equal to the phase current limit after the scaling down, or the predetermined range is 180°<β+120°<360° if the phase current of a C-phase is equal to the phase current limit after the scaling down.

14. The system of claim 11 wherein scaling down each of the positive-sequence and negative-sequence reactive currents comprises uniformly scaling based on a change in the positive-sequence and negative-sequence reactive currents or uniformly scaling by determining a scaling factor that causes at least one of the phase currents equal to the phase current limit.

15. The system of claim 14, wherein determining the scaling factor comprises performing:

determining all of the possible solutions for the scaling factor using a quadratic relationship to the phase current limit;

discarding any solutions to the scaling factor that are outside of the [0,1] range; and selecting a largest solution to the scaling factor that makes at least one of the phases equal to or below the phase current limit and the other phases below the phase current limit.

16. The system of claim 11, wherein determining the non-zero positive-sequence revised active current comprises determining a magnitude of an active current that satisfies the relationship of $|I_q| = I_{max} = \sqrt{|I_x|^2 + |I_y|^2}$, where $I_x$ comprises the positive-sequence reactive current $(I_Q{}^+)$ and the angle between the positive-sequence reactive current and either the negative-sequence reactive current $(\beta)$, the negative-sequence reactive current $(\beta)$ minus $2\pi/3$, or the negative-sequence reactive current $(\beta)$ plus $2\pi/3$ and $I_y$ comprises the negative-sequence reactive current $(I_Q{}^-)$ and the angle between the positive-sequence reactive current and either the negative-sequence reactive current $(\beta)$, the negative-sequence reactive current $(\beta)$ minus $2\pi/3$, or the negative-sequence reactive current $(\beta)$ plus $2\pi/3$.

17. The system of claim 11, wherein scaling down each of the positive-sequence and negative-sequence reactive currents comprises non-uniform scaling where:

the negative-sequence reactive current is decreased at a higher rate than the positive-sequence reactive current, the positive-sequence reactive current is decreased at a higher rate than the negative-sequence reactive current, or the positive-sequence reactive current is decreased at a higher rate than the negative-sequence reactive current and superimposed positive-sequence reactive currents are greater than superimposed negative-sequence reactive currents.

18. The system of claim 11, wherein scaling down each of the positive-sequence and negative-sequence reactive currents comprises non-uniform scaling using optimization, where;

the negative-sequence reactive current is decreased at a higher rate than the positive-sequence reactive current, the positive-sequence reactive current is decreased at a higher rate than the negative-sequence reactive current, or the positive-sequence reactive current is decreased at a higher rate than the negative-sequence reactive current and superimposed positive-sequence reactive currents are greater than superimposed negative-sequence reactive currents.

19. The system of claim 11, wherein scaling down each of the positive- sequence and negative-sequence reactive currents comprises non-uniform scaling where the negative-sequence current is prioritized to be decreased before the positive-sequence current or where the positive-sequence current is prioritized to be decreased before the negative-sequence current.

20. A method for determining active and reactive currents during asymmetrical low-voltage ride through (LVRT) conditions at an inverter, the method executable on a controller or executed as a model on a computer, the method comprising:

receiving an indication of an LVRT condition; and capping the positive-sequence and negative-sequence reactive currents at prespecified limits and outputting the capped positive-sequence and negative-sequence reactive currents to the inverter, and determining a maximum active current for associated positive-sequence and negative-sequence reactive currents by determining a largest active current magnitude and outputting the largest active current and associated positive-sequence and negative-sequence reactive currents to the inverter.

* * * * *